(12) United States Patent
Besida

(10) Patent No.: US 10,331,011 B2
(45) Date of Patent: Jun. 25, 2019

(54) OPTICAL DEVICE WITH PHOTON FLIPPING

(71) Applicant: COMMISSARIAT À L'ÉNGERGIE ATOMIQUE ET AUX ÉNERGIES ALTERNATIVES, Paris (FR)

(72) Inventor: Olivier Besida, Paris (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 245 days.

(21) Appl. No.: 15/302,678

(22) PCT Filed: Apr. 9, 2015

(86) PCT No.: PCT/EP2015/057658
§ 371 (c)(1),
(2) Date: Oct. 7, 2016

(87) PCT Pub. No.: WO2015/155265
PCT Pub. Date: Oct. 15, 2015

(65) Prior Publication Data
US 2017/0023844 A1    Jan. 26, 2017

(30) Foreign Application Priority Data
Apr. 10, 2014 (FR) ..................... 14 53176

(51) Int. Cl.
*G02F 1/365* (2006.01)
*G02B 19/00* (2006.01)
(Continued)

(52) U.S. Cl.
CPC ......... *G02F 1/365* (2013.01); *G02B 6/02042* (2013.01); *G02B 6/02052* (2013.01);
(Continued)

(58) Field of Classification Search
CPC ...... G02F 1/365; G02F 1/353; G02F 2202/32; G02B 19/0019; G02B 6/02052;
(Continued)

(56) References Cited

U.S. PATENT DOCUMENTS

| 6,744,960 B2 * | 6/2004 | Pelka ..................... B82Y 10/00 |
| | | 362/259 |
| 7,079,240 B2 * | 7/2006 | Scherer .................. B82Y 20/00 |
| | | 356/128 |

(Continued)

OTHER PUBLICATIONS

International Search Report as issued in International Patent Application No. PCT/EP2015/057658, dated Jun. 10, 2015.
(Continued)

*Primary Examiner* — Ryan A Lepisto
(74) *Attorney, Agent, or Firm* — Pillsbury Winthrop Shaw Pittman LLP

(57) ABSTRACT

An optical device with photon flipping for converting an incident light flux into a practically monochromatic light beam, the device including a cladding area including a photon crystal microstructure, the photon crystal microstructure having an allowed spectral band and a spectral band gap; a flipping area including a flipping fluorescent dye which has a spectral band for absorbing fluorescence, which covers at least part of the allowed spectral band, and a spectral band for emitting fluorescence, which covers at least part of the spectral band gap of the photon crystal microstructure; a central area arranged to enable propagation of a monochromatic light beam having a wavelength in the spectral band gap, the central area being surrounded by the photon crystal microstructure; the core area having a thickness which is less than or equal to five times the wavelength of the maximum fluorescence emission of the flipping fluorescent dye.

13 Claims, 9 Drawing Sheets

(51) Int. Cl.
*G02B 6/02* (2006.01)
*H01L 31/054* (2014.01)
*G02F 1/35* (2006.01)
*G02B 6/036* (2006.01)

(52) U.S. Cl.
CPC ..... *G02B 6/02347* (2013.01); *G02B 6/03694* (2013.01); *G02B 19/0019* (2013.01); *G02F 1/353* (2013.01); *H01L 31/054* (2014.12); *G02B 6/023* (2013.01); *G02B 6/02338* (2013.01); *G02B 6/02366* (2013.01); *G02F 2202/32* (2013.01); *Y02E 10/52* (2013.01)

(58) Field of Classification Search
CPC ............ G02B 6/02042; G02B 6/03694; G02B 6/02347; G02B 6/02366; G02B 6/02338; G02B 6/023; H01L 31/054; Y02E 10/52
See application file for complete search history.

(56) References Cited

U.S. PATENT DOCUMENTS 7,333,705 B2 * 2/2008 Hyde ..................... B82Y 20/00
385/122
7,499,619 B2 * 3/2009 Hyde ..................... B82Y 20/00
385/122
7,787,734 B2 * 8/2010 Hyde ..................... B82Y 20/00
385/129
9,461,193 B2 * 10/2016 Forrest ................. H01L 31/055

OTHER PUBLICATIONS

Smolka, S., et al., "Highly efficient fluorescence sensing with hollow core photonic crystal fibers," Optics Express, vol. 15, No. 20, Jan. 2007, XP055155776, pp. 12783-12791.

Chen, Z., et al., "Low-loss splicing of photonic crystal fibres by controlled hole collapse," Lasers and Electro-Optics 2009, and 2009 Conference on Quantum Electronics and Laser Science Conference. CLEO/QELS 2009, Jun. 2009, XP031521153, pp. 1-2.

Okamoto, T., et al., "Towards plasmonic band gap laser," Applied Physics Letters, vol. 85, No. 18, Jan. 2004, XP012063145, pp. 3968-3970.

Kato, G., et al., "Pore size dependence of self-assembled type photonic crystal on dye-sensitized solar cells efficiency utilising Chlorine e6," Journal of Porous Materials, vol. 21, No. 2, Dec. 2013, XP055155853, pp. 165-176.

* cited by examiner

OPTICAL DEVICE WITH PHOTON FLIPPING

CROSS REFERENCE TO RELATED APPLICATIONS

This applications is the U.S. National Stage of PCT/EP2015/057658, filed Apr. 9,2015, which in turn claims priority to French Patent Application No. 1453176 filed Apr. 10, 2014, the entire contents of all applications are incorporated herein by reference in their entireties.

TECHNICAL FIELD OF THE INVENTION

The technical field of the invention is that of optical devices with photon flipping. An aspect of the present invention relates to an optical device with photon flipping for converting a flux of incident light into a quasi-monochromatic light beam. The present invention notably finds application in the field of photovoltaic quantum solar concentrators.

TECHNOLOGICAL BACKGROUND OF THE INVENTION

Photonic crystal optical fibres, also called "microstructured fibres" or "photonic forbidden band fibres", use a light confinement mechanism based on the periodicity of their index structure. Two types of microstructured fibres may principally be distinguished:
  high index core fibres, in which a cladding including a periodic arrangement of low index inclusions surrounds a defect, that is to say an absence of inclusion, which serves as core,
  low index core fibres, in which a cladding including a periodic arrangement of high index inclusions surrounds a defect, that is to say an absence of inclusion, which serves as core.

In the first case of high index core fibres, it is possible to assimilate the index of the microstructured cladding with an average index that is less than the index of the core. The confinement mechanism may thus be assimilated with the guiding mechanism in the dielectric waveguide.

In the second case of low index core fibres, the periodic index structure of the microstructured cladding leads to the formation of forbidden energy bands: thus, certain wavelengths cannot propagate in the microstructured cladding. Consequently, if a defect is introduced into the structure that can support a mode of which the effective index is lower than that of the core and is located in the forbidden band, light will be confined in this defect. In other words, the photonic crystal microstructure of the cladding will behave as a reflective mirror for the photons of which the directions of propagation are transversal with respect to the axis of the fibre and of which the wavelength lies within the forbidden band.

Several types of microstructured fibres exist:
  In the case of a microstructured fibre of Bragg fibre type, the photonic crystal is obtained by the alternation of concentric layers of quarter wave type of two materials of different indices, for example polymethyl methacrylate PMMA on the one hand and polystyrene on the other hand.
  In the case of a microstructured fibre of "Holey fibre" type, tubular holes parallel to the axis of the fibre, filled with air, that is to say of optical index equal to 1, surround the core of the fibre, whereas the remainder of the matrix of the fibre is formed of a material, for example polymer, of optical index greater than 1. The holes produce a forbidden band and may be arranged according to a hexagonal "honeycomb" network, according to a square network or according to one or more concentric rings around the core.

Furthermore, fluorescent concentrators are notably developed in the field of solar energy research in order to improve the efficiency of solar cells. A fluorescent concentrator is typically made of PMMA and contains a fluorescent dye. The fluorescent dye has an absorption spectral band and an emission spectral band. When a photon, of wavelength $\lambda_a$ lying within the absorption spectral band of the dye, reaches the concentrator and encounters a molecule of dye, it is absorbed by said molecule then re-emitted at a wavelength lying within the emission spectral band of the dye. The emission wavelength $\lambda_e$ is greater than the absorption wavelength $\lambda_a$, which reflects the fact that the re-emitted photon has lower energy than the photon initially absorbed.

The field of optical devices with photon flipping is based on the two fields which have been mentioned, that is to say photonic crystal optical fibres and fluorescent concentrators. An optical device with photon flipping thus typically comprises a core area, a flip area including a fluorescent flip dye and a microstructured cladding area.

The microstructured cladding area has an allowed spectral band and a forbidden spectral band. Photons of wavelength lying within the allowed spectral band can propagate in the cladding area, whereas photons of wavelength lying within the forbidden spectral band cannot propagate in the cladding area.

The fluorescent dye is chosen so that its absorption spectral band overlaps at least partially the allowed spectral band of the microstructured cladding area, and so that its emission spectral band overlaps at least partially the forbidden spectral band of the microstructured cladding area.

An optical device with photon flipping thus makes it possible to convert an incident light flux, captured laterally by the microstructured cladding area, into a quasi-monochromatic and anisotropic beam propagating in the core area. Nevertheless, optical devices with photon flipping of the prior art only have low conversion efficiency, less than 10% for thicknesses of light guide greater than a millimetre.

SUMMARY OF THE INVENTION

The present invention makes it possible to resolve this drawback, by proposing an optical device with photon flipping having better conversion efficiency.

An aspect of the invention thus relates to an optical device with photon flipping for converting an incident light flux into a quasi-monochromatic light beam, the optical device comprising:
  a cladding area including a photonic crystal microstructure, the photonic crystal microstructure having an allowed spectral band and a forbidden spectral band,
  a flip area including a fluorescent flip dye having:
    a fluorescence absorption spectral band overlapping at least partially the allowed spectral band of the photonic crystal microstructure, and
    a fluorescence emission spectral band overlapping at least partially the forbidden spectral band of the photonic crystal microstructure,
  a core area arranged to enable the propagation of a monochromatic light beam having a wavelength lying within the forbidden spectral band of the photonic crystal microstructure, the photonic crystal microstructure surrounding the core area;

the core area having a thickness E1 less than or equal to five times the wavelength of the maximum fluorescence emission of the fluorescent flip dye.

In the present description, "quasi-monochromatic light beam" is taken to mean a beam of light having a spectral band of which the full width at half maximum is less than or equal to the minimum between the full width at half maximum of the emission spectral band of the fluorescent dye and the full width at half maximum of the forbidden spectral band of the photonic crystal microstructure. As an example, the full width at half maximum of the spectral band of the quasi-monochromatic light beam is generally less than 100 nm, and often less than 50 nm.

"The photonic crystal microstructure surrounds the core area" is taken to mean the fact that the photonic crystal microstructure partially or completely surrounds the core area.

"Photon flipping" is taken to mean the fact that a luminous beam of which the photons propagate substantially at least along a straight reference line is obtained from a multidirectional luminous flux, of which the photons propagate along multiple directions of propagation in space. An optical device with photon flipping thus enables the change of direction, or in other words the flipping, of at least a part of the photons of an initially multidirectional luminous flux.

Thanks to the invention, the cladding area including a photonic crystal microstructure, designated "microstructured cladding area", is used in order to capture an incident light flux. The allowed spectral band of the microstructured cladding area overlaps at least partially the spectrum of the incident light flux. The photons of the incident light flux of which the wavelength lies within the allowed spectral band of the microstructured cladding area can thus propagate through the microstructured cladding area. The fluorescent dye of the flip area is chosen in order that its fluorescence absorption spectral band overlaps at least partially the allowed spectral band of the microstructured cladding area, and that its fluorescence emission spectral band overlaps at least partially the forbidden spectral band of the microstructured cladding area. Thus, photons of which the wavelength lies within both the allowed spectral band of the microstructured cladding area and the fluorescence absorption spectral band of the fluorescent dye can propagate in the microstructured cladding area and reach the flip area, to be absorbed by the fluorescent dye then be re-emitted by the fluorescent dye at a wavelength lying within both the fluorescence emission spectral band of the fluorescent dye and the forbidden spectral band of the microstructured cladding area. The fact that the core area has a thickness E1 less than or equal to five times the wavelength of the maximum fluorescence emission of the fluorescent flip dye advantageously makes it possible to create a quantum effect at the heart of the phenomenon of photon flipping, and thus to propose an optical device with photon flipping with improved conversion efficiency.

This quantum effect has in fact for origin the anisotropic inhibition of spontaneous de-excitation in near field of the fluorescent dye, due to electromagnetic interaction of the photonic crystal with the wave function of the photons re-emitted by the fluorescent dye. Said quantum effect characterises the amplitude of the quantum interaction between the photonic crystal of the cladding area and fluorescent de-excitation of the fluorescent dye. The intensity of this quantum effect is strongly influenced by the diameter of the central core of the fibre. The diameter of the central core of the fibre is thus chosen less than, and advantageously five times less than, the value of the wavelength of the emitted photons, because said quantum effect only takes place in near field. Obtaining said quantum effect is moreover all the more favoured the higher the quality factor of the waveguide formed by the core of the fibre. A high quality factor of the waveguide formed by the core of the fibre in fact favours the Purcell effect. The Purcell effect exalts fluorescence while amplifying the fluorescence quantum yield of the dye, while favouring radiative transitions to the detriment of non-radiative transitions. To do so, the photonic crystal is advantageously the most efficient possible: it involves on the one hand radially increasing the volume of the photonic crystal so that the photons can encounter a large number of patterns within said photonic crystal, and on the other hand that the characteristic dimensions of said photonic crystal are very little dispersed—the dispersion of said characteristic dimensions is advantageously less than or equal to 5%.

Apart from the characteristics that have been mentioned in the preceding paragraph, the optical device with photon flipping according to the invention may have one or more additional characteristics among the following, considered individually or according to any technically possible combinations thereof:

The allowed spectral band of the microstructured cladding area is advantageously the widest possible. Thus, the allowed spectral band of the microstructured cladding area overlaps the largest possible part of the spectrum of the incident light flux.

The allowed spectral band of the microstructured cladding area is advantageously comprised within the fluorescence absorption spectral band of the flip dye. Thus, photons of wavelength lying within the allowed spectral band of the microstructured cladding area are also of wavelength lying within the fluorescence absorption spectral band of the flip dye. In other words, all the photons able to propagate in the microstructured cladding area are also capable of being absorbed by the flip dye. Generally speaking, the overlap between the allowed spectral band of the microstructured cladding area and the fluorescence absorption spectral band of the flip dye is advantageously maximum.

The fluorescence emission spectral band of the flip dye is advantageously comprised in the forbidden spectral band of the cladding area. Thus, photons of wavelength lying within the fluorescence emission spectral band of the flip dye are also of wavelength lying within the forbidden spectral band of the cladding area. In other words, all the photons emitted by the flip dye are capable of being guided by the core area. Generally speaking, the overlap between the emission fluorescence spectral band of the flip dye and the forbidden spectral band of the cladding area is advantageously maximum.

The thickness E1 of the core area is advantageously less than or equal to three times the wavelength of the maximum fluorescence emission of the fluorescent flip dye. This thus contributes to favouring the quantum effect behind the phenomenon of photon flipping in order to propose an optical device with photon flipping with optimised conversion efficiency. The core area is preferentially of dielectric waveguide type.

The flip area has a thickness E2 such that:

$$E2 < \frac{\lambda_E}{4*n}$$

with $\lambda_E$ the wavelength of the maximum fluorescence emission of the fluorescent flip dye and n the refractive index of the flip area. This thus contributes to favouring the quantum effect behind the phenomenon of photon flipping in order to propose an optical device with photon flipping with optimised conversion efficiency. Advantageously, the thickness E2 of the flip area is chosen such that:

$$E2 < \frac{\lambda_E}{8*n}$$

The flip area is situated in at least one part of the cladding area. Thus, the photon flipping area is advantageously distinct from the area of propagation in the core area. Consequently, the fluorescent flip dye is located in the cladding area and does not lead to any attenuation in the core area. This notably enables the core area to be air.

The flip area is advantageously situated in at least one part of the core area. Thus, the coupling of photons propagating in the cladding area with fundamental modes propagating in the core area is favoured. It then involves choosing for the fluorescent flip dye a sufficiently high optical density, at the absorption wavelength, so that photon flipping is efficient, while being sufficiently low, at the emission wavelength, to enable good propagation of the quasi-monochromatic beam.

Advantageously, the flip area is situated in at least one central part of the core area. In this way, high coupling is obtained between the electric dipolar moment of the radiative transition of the fluorescence emission photons and the fundamental modes of the core area of the device according to an aspect of the invention. Said coupling is all the greater the more said electrical dipolar moment is oriented perpendicularly to the axis of propagation of the quasi-monochromatic beam in the core area.

The flip area is advantageously situated in at least one part of the cladding area and in at least one part of the core area. Thus, coupling of the fluorescence emission photons with the fundamental modes propagating in the core area is facilitated, while making it possible to limit the optical density in the core area, said optical density being capable of penalising the propagation of photons in the core area.

The optical device with photon flipping has optical fibre geometry, the optical device with photon flipping extending along a reference axis and having symmetry of revolution around said reference axis.

In this case, the core area of the optical device with photon flipping is substantially cylindrical and has a lateral surface of revolution. "The core area is surrounded by the photonic crystal microstructure of the cladding area" is taken to mean the fact that the microstructured cladding area is in contact with the lateral surface of revolution of the core area. Still according to this case, a thickness is measured along a radial direction with respect to the reference axis.

Such a device with optical fibre geometry advantageously makes it possible to facilitate the formation of a multi-core device, using for example several different fluorescent flip dyes. Moreover, such optical fibre geometry enables the formation of a hollow core area, using air as propagating medium. Finally, very precise manufacturing techniques are available for optical fibres, making it possible to obtain very small geometric dispersions.

Alternatively, the optical device with photon flipping has optical film geometry, the optical device with photon flipping extending along a reference plane and having symmetry with respect to the reference plane.

In this case, the core area is a layer extending parallel to the reference plane, whereas the microstructured cladding area has first and second regions extending parallel to the reference plane. "The core area is surrounded by the photonic crystal microstructure of the cladding area" is taken to mean the fact that the core area is comprised between the first and second regions of the cladding area. In other words, the first and second regions of the cladding area extend in contact with the core area, respectively on either side of the core area. Still according to this case, a thickness is measured along a direction perpendicular to the reference plane. Such a device with optical film geometry advantageously offers a larger collection surface for the photons of the incident light flux than in the case of optical fibre geometry. Furthermore, existing techniques of production by lamination make it possible to produce directly and rapidly large collection surfaces. It should all the same be noted that to obtain collection surfaces of nanometric dimensions by lamination, several lamination steps are generally required.

The optical device with photon flipping advantageously comprises a first conversion area situated around the flip area, the first conversion area including a first fluorescent conversion dye having a fluorescence emission spectral band overlapping at least partially the fluorescence absorption spectral band of the fluorescent flip dye. Thus, this advantageously enables an increase in the quantity of incident photons, from the incident light flux, that the flip dye of the flip area is going to be able to absorb. Advantageously, the sum of the absorption spectral bands of the first fluorescent conversion dye and the fluorescent flip dye covers the widest possible range of the solar spectrum. The overlap between the fluorescence emission spectral band of the flip dye and the fluorescence absorption spectral band of the flip dye is advantageously maximum.

Another aspect of the invention relates to a multi-core optical device with photon flipping comprising:
 a core area comprising a plurality of optical devices with photon flipping according to an aspect of the invention, and
 a cladding area surrounding the core area.

Thus, this contributes advantageously to optimising the collection of incident photons. A multi-core optical device with photon flipping has in fact an optimised total photon collecting surface. The total photon collecting surface of the multi-core optical device with photon flipping is the sum of the photon collecting surfaces of each optical device with photon flipping. The photon collecting surface of an optical device with photon flipping is the surface of the core area of said optical device with photon flipping.

Another aspect of the invention relates to an electricity production device comprising:

at least one optical device with photon flipping according to an aspect of the invention, and at least one photovoltaic cell arranged to be able to capture the quasi-monochromatic light beam emitted at the output of the at least one optical device with photon flipping according to an aspect of the invention.

Such an electricity production device advantageously makes it possible to reduce significantly, typically of the order of 100 times, the surface of the photovoltaic semiconductor of the at least one photovoltaic cell used, compared to an electricity production device using a device with photon flipping according to the prior art. In fact, the optical device with photon flipping according to an aspect of the invention, which is used in said electricity production device, makes it possible to obtain a light beam on the one hand more intense and on the other hand quasi-monochromatic at the wavelength corresponding to the maximum quantum efficiency of the photovoltaic semiconductor.

Such an electricity production device also makes it possible to dispense with any system for following the source of the incident light flux, that is to say typically the sun. In fact, an optical device with photon flipping according to an aspect of the invention operates efficiently, independently of the incident angle of the incident light flux with respect to the optical device with photon flipping.

Another aspect of the invention relates to a catalysis device comprising:
  at least one optical device with photon flipping according to an aspect of the invention, and
  at least one catalytic cell arranged to be able to capture the quasi-monochromatic light beam emitted at the output of the at least one device with photon flipping.

Another aspect of the invention relates to a laser emission device comprising:
  at least one optical device with photon flipping according to an aspect of the invention, and
  at least one laser arranged to be able to capture the quasi-monochromatic light beam emitted at the output of the at least one device with photon flipping.

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION OF AT LEAST ONE EMBODIMENT OF THE INVENTION

Unless stated otherwise, a same element appearing in the different figures has a single reference.

In the present description, the terms "microstructure", "photonic crystal" and "photonic crystal microstructure" are employed indiscriminately.

In the present description, the terms "dye", "fluorescent dye" and "fluorescence dye" are employed indiscriminately.

In the present description, the terms "fluorescence absorption spectral band" and "absorption spectral band" are employed indiscriminately. In the same way, the terms "fluorescence emission spectral band" and "emission spectral band" are employed indiscriminately.

Figure 1:
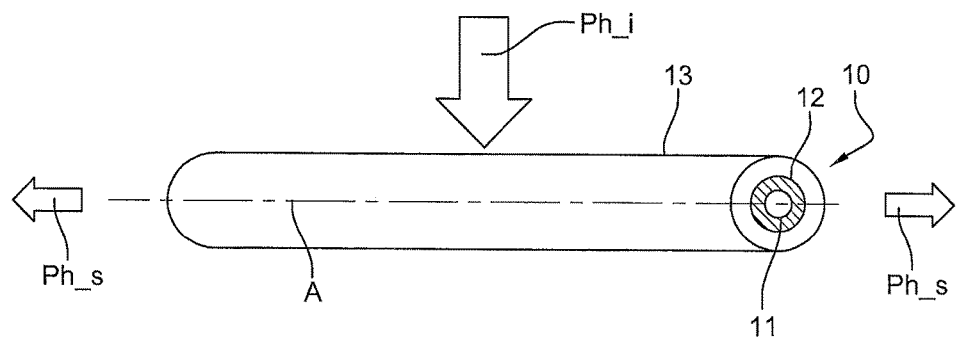
FIG. 1 schematically represents a perspective view of an optical device with photon flipping according to a first variant of a first embodiment of the invention.

FIG. 1 shows schematically the operating principle of an optical device with photon flipping 10 according to a first variant of a first embodiment of the invention. The optical device with photon flipping 10 according to this first embodiment has optical fibre geometry: the optical device with photon flipping 10 extends along a reference axis A and has symmetry of revolution around said reference axis A. An optical device with photon flipping according to a second embodiment of the invention, having optical film geometry, will be described hereafter.

The optical fibre with photon flipping 10, designated "FORP fibre" comprises:
- a core area 11,
- a flip area 12 comprising a fluorescent flip dye, and
- a microstructured cladding area 13 comprising a photonic crystal, the microstructured cladding area surrounding the core area 11.

According to the first variant of the first embodiment of the invention, the flip area 12 is located in at least one part of the microstructured cladding area 13, said at least one part being in contact with the core area 11 and surrounding the core area 11.

FIG. 1 schematically shows a flux of incident photons Ph_i. The flux of incident photons Ph_i is typically polychromatic and multidirectional; it may for example be solar radiation. In the case where the flux of incident photons Ph_i is polychromatic, it has by definition a wide spectrum. As an indication, the solar spectrum extends at ground level between 280 nm and 4000 nm. More particularly, in the remainder of this description, the case of a polychromatic flux of incident photons Ph_i is considered; nevertheless, said flux of incident photons Ph_i may absolutely be monochromatic or quasi-monochromatic. Similarly, more particularly in the remainder of this description, the case is considered of a multidirectional flux of incident photons Ph_i, but said flux of incident photons Ph_i may absolutely be unidirectional. The photonic crystal of the microstructured cladding area 13 has an allowed spectral band and a forbidden spectral band. The incident photons Ph_i of which the wavelength lies within the allowed spectral band of the photonic crystal can propagate in the microstructured cladding area 13. The allowed spectral band of the photonic crystal is advantageously as wide as possible. Thus, this enables the largest possible part of the incident photons Ph_i to propagate in the microstructured cladding area 13.

The fluorescent flip dye of the flip area 12 has a fluorescence absorption spectral band and a fluorescence emission spectral band. The fluorescence emission spectral band is spectrally shifted to higher wavelengths with respect to the fluorescence absorption spectral band: this is the Stoke's shift. The flip dye is thus able to absorb a photon of wavelength lying within its fluorescence absorption spectral band, then re-emit it at a higher wavelength lying within its fluorescence emission spectral band. The re-emitted photon is of higher wavelength, thus of lower energy, than the photon initially absorbed.

The flip area 12 is situated in such a way that incident photons Ph_i propagating in the microstructured cladding area 13 can reach the flip area 12. At the same time, the absorption spectral band of the flip dye overlaps at least partially the allowed spectral band of the microstructured cladding area 13. Thus, incident photons Ph_i propagating in the microstructured cladding area 13 and of which the wavelength lies within the absorption spectral band of the flip dye may be absorbed by the flip dye, then re-emitted at a wavelength lying within the emission spectral band of said flip dye.

The fluorescence emission spectral band overlaps at least partially the forbidden spectral band of the microstructured cladding area 13. At the same time, the flip area 12 is situated in such a way that photons re-emitted by the flip dye can reach the core area 11. The core area 11 is moreover arranged to enable the propagation of photons of wavelength lying within at least one part of the forbidden spectral band of the microstructured cladding 13. Thus, at least one part of the photons re-emitted by the flip dye of the flip area 12 may be guided in the core area 11: they are output photons Ph_s, represented in FIG. 1.

Figure 2:
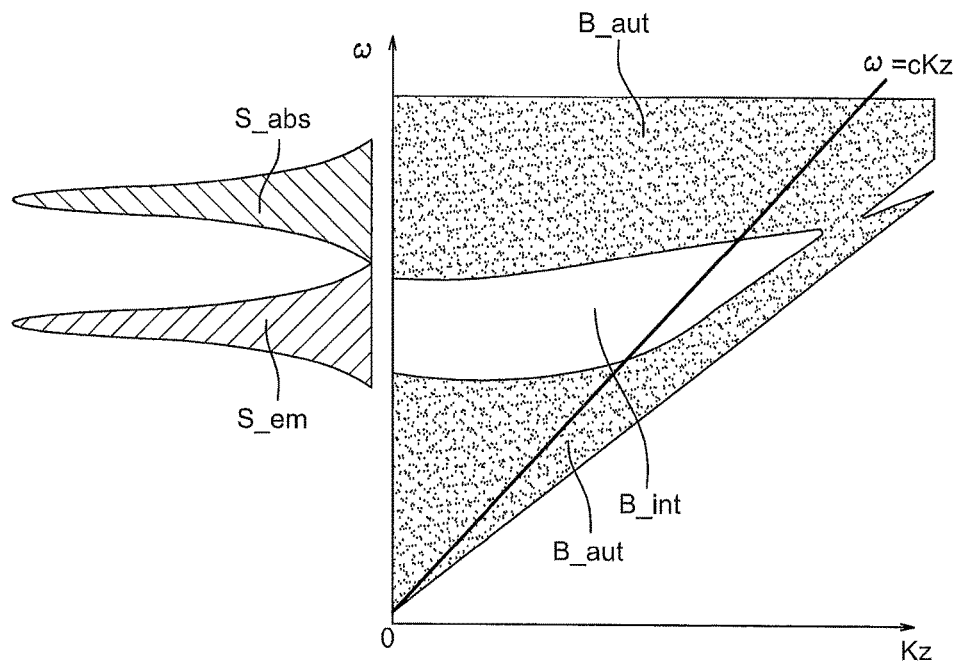
FIG. 2 shows a diagram of the allowed propagation frequencies ω as a function of the wave vector $k_z$, in a photonic crystal microstructure of a cladding area of an optical device with photon flipping according to an embodiment of the invention.

FIG. 2 shows a diagram of the allowed propagation frequencies ω as a function of the wave vector $k_z$, in the photonic crystal microstructure of the cladding area of an optical device with photon flipping according to an embodiment of the invention. Hereafter, the particular example of a FORP fibre 10 according to the first embodiment of the invention will be taken. The wave vector $k_z$ is a vector perpendicular to the wave front of a monochromatic wave, which indicates the direction of propagation of said monochromatic wave. The diagram of FIG. 2 thus shows:
- the allowed spectral band B_aut of the photonic crystal microstructure of the microstructured cladding area 13 of the FORP fibre 10, and
- the forbidden spectral band B_int of the photonic crystal microstructure of the microstructured cladding area 13 of the FORP fibre 10.

Photon propagation modes exist in the allowed spectral band B_aut. On the contrary, no photon propagation mode exists in the forbidden spectral band B_int.

FIG. 2 also shows:
- the absorption spectrum S_abs of the flip dye of the flip area 12 of the FORP fibre 10, and
- the emission spectrum S_em of the flip dye of the flip area 12 of the FORP fibre 10.

The diagram of FIG. 2 thus shows that:
- the absorption spectrum S_abs of the flip dye partially overlaps the allowed spectral band B_aut. In the particular case of FIG. 2, the absorption spectrum S_abs of the flip dye is comprised in the allowed spectral band B_aut. The absorption of photons by the flip dye is thus isotropic,
- the emission spectrum S_em of the flip dye completely overlaps the forbidden spectral band B_int. In the particular case of FIG. 2, the forbidden spectral band B_int is comprised in the emission spectrum S_em of the flip dye. The emission of photons by the flip dye is thus anisotropic. In fact, photons emitted by the flip dye and of wavelength lying within the forbidden spectral band B_int cannot propagate in the microstructured cladding area 13 that surrounds the core area 11. The photons emitted by the flip dye thus can only propagate in the core area 11.

Advantageously, the forbidden spectral band B_int is the most omnidirectional possible at the wavelength of the photons re-emitted by the flip dye. In other words, for a given frequency, the range of values of the wave vector $k_z$ prohibiting the propagation of said re-emitted photons must be as large as possible. Let β be the angle of emission of photons re-emitted by the fluorescent flip dye, § being measured with respect to the axis A of the FORP fibre 10. This emission angle β is expressed by the formula:

$$\beta = \cos^{-1}\left(\frac{c * k_z}{2 * \pi * \vartheta * n_c}\right)$$

with c the speed of propagation of light, v the frequency of the re-emitted photons and $n_c$ the optical index in the core area of the FORP fibre.

A spectral band is completely forbidden at a given frequency, if no propagation mode exists for |cos β| lying within the interval [0,1]. The photonic crystal is thus selected so that its forbidden spectral band is the most extended in wave vector $k_z$ or in cos(β), that is to say in such a way that the solid angle Ω, corresponding to the entire anisotropic inhibition area of fluorescence de-excitation, is as large as possible. The anisotropic efficiency of the photonic crystal is given by the ratio $$n_{anistropie} = \frac{\Omega}{4\pi}$$

The flip dye is thus selected so that its emission spectrum overlaps at least partially the forbidden spectral band of the photonic crystal microstructure. On the other hand, the quantum coupling between the fluorescent flip dye and the photonic crystal microstructure must be as high as possible in order to contribute to favouring the efficiency of the photon flipping phenomenon. This latter condition is in particular linked to the respective dimensions of the core area 11 and the flip area 12 of the FORP fibre, as will be explained hereafter in relation with FIGS. 3a, 3b and 3c.

Figure 3A:
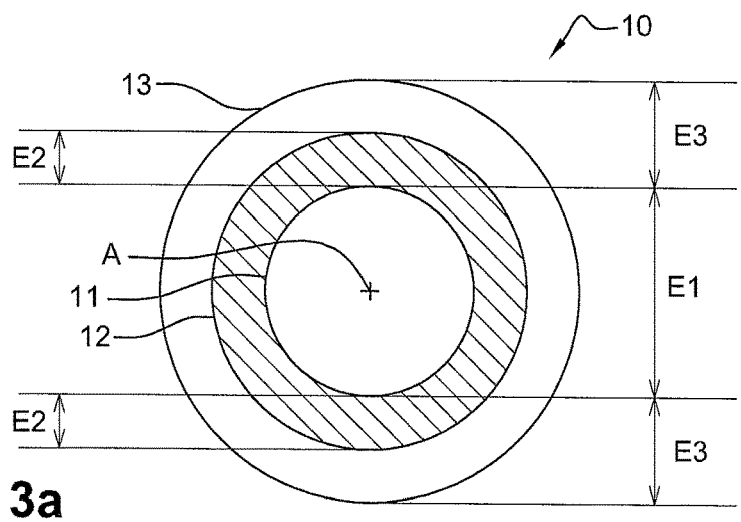
FIG. 3a schematically represents a sectional view of the optical device with photon flipping of FIG. 1.
Figure 3B:
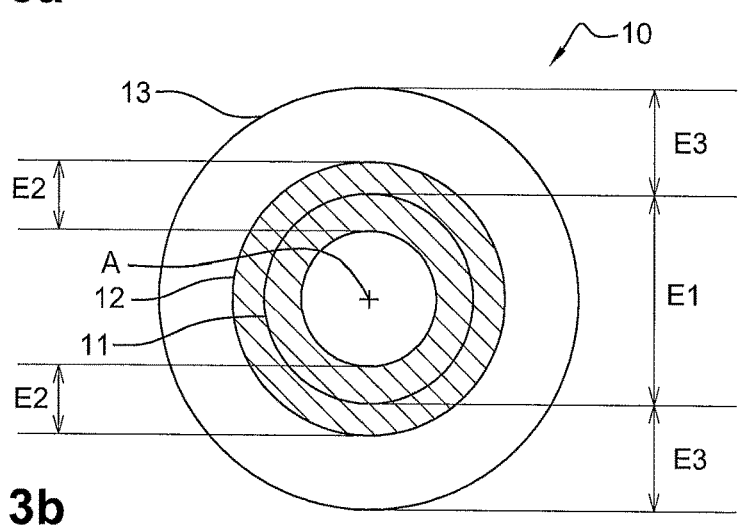
FIG. 3b schematically represents a sectional view of an optical device with photon flipping according to a second variant of the first embodiment of the invention.
Figure 3C:
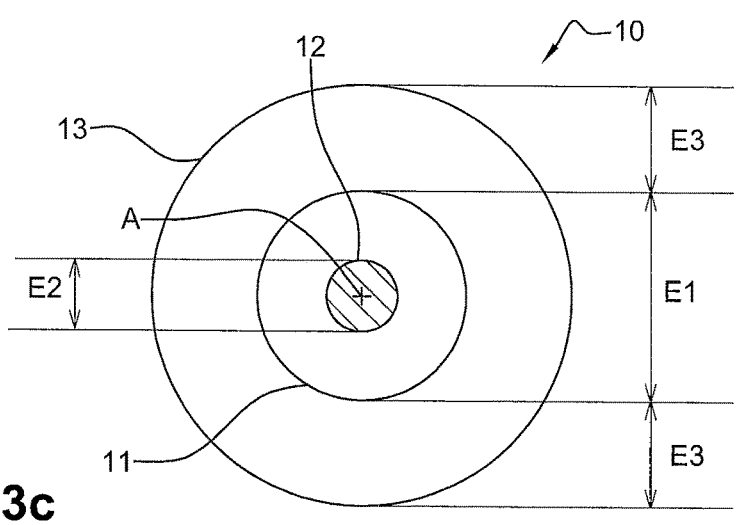
FIG. 3c schematically represents a sectional view of an optical device with photon flipping according to a third variant of the first embodiment of the invention.

FIGS. 3a, 3b and 3c are described jointly.

FIG. 3a schematically represents a sectional view of the FORP fibre 10 of FIG. 1, according to the first variant described previously in which the flip area 12 is located in at least one part of the microstructured cladding area 13.

FIG. 3b schematically shows a sectional view of a FORP fibre 10 according to a second variant of the first embodiment of the invention, in which the flip area 12 is located in at least one part of the core area 11 and in at least one part of the microstructured cladding area 13.

FIG. 3c schematically represents a sectional view of a FORP fibre 10 according to a third variant of the first embodiment of the invention, in which the flip area 12 is located in at least one part of the core area 11.

FIGS. 3a, 3b and 3c show:
a core area 11 having a thickness E1. In the case of the first embodiment particularly illustrated in FIGS. 3a, 3b and 3c, the core area 11 is a solid cylinder of circular section and of axis A. The thickness E1 of the core area 11 is then the diameter of said circular section.
a microstructured cladding area 13 having a thickness E3. In the case of the first embodiment particularly illustrated in FIGS. 3a, 3b and 3c, the microstructured cladding area 13 is a hollow cylinder of first annular section and of axis A, in other words a tube, surrounding the core area 11. The thickness E3 is then the thickness of the first annular section, measured radially with respect to the axis A.
a flip area 12 having a thickness E2. In the case of the first embodiment particularly illustrated in FIGS. 3a, 3b and 3c, the flip area 12 is a hollow cylinder of second annular section and of axis A, in other words a tube. The thickness E2 is then the thickness of the second annular section, measured radially with respect to the axis A.

According to the first variant of the first embodiment, the flip area 12 is a hollow cylinder of second annular section and of axis A, in other words a tube, which surrounds the core area 11. The thickness E2 of the flip area 12 is less than or equal to the thickness E3 of the microstructured cladding area 13. When the thickness E2 of the flip area 12 is equal to the thickness E3 of the microstructured cladding area 13, the flip area 12 and the microstructured cladding area 13 are merged. According to the first variant of the first embodiment, the core area 11 may be either solid, that is to say filled with a solid material, for example polymer; or hollow, that is to say not filled with a solid material, and including for example air.

According to the second variant of the first embodiment, the flip area 12 is located at least in part in the core area 11 and at least in part in the microstructured cladding area 13. The flip area 12 is then:
either a hollow cylinder of second annular section and of axis A, in other words a tube, when the flip area 12 only overlaps a part of the core area 11;
or a solid cylinder of circular section and of axis A, when the flip area 12 completely overlaps the core area 11.

The thickness E2 of the flip area 12 is less than or equal to the sum of the radius of the core area 11 and the thickness E3 of the microstructured cladding area 13. In other words, the thickness E2 of the flip area 12 is such that $$E2 \leq \frac{E1}{2} + E3$$

When the thickness E2 of the flip area 12 is equal to the sum of the radius $$\frac{E1}{2}$$

or the core area 11 and the thickness E3 of the microstructured cladding area 13, the flip area 12 entirely overlaps the microstructured area 13 and the core area 11. According to the second variant of the first embodiment, the core area 11 is solid, that is to say filled with a solid material, for example polymer.

According to the third variant of the first embodiment, the flip area 12 is located at least in part in the core area 11. The flip area 12 is then:
either a hollow cylinder of second annular section and of axis A, in other words a tube. In this case, the thickness E2 of the flip area 12 is less than the radius t,?E1/2 of the core area 11;
or a solid cylinder of circular section and of axis A. In this case, the thickness E2 of the flip area 12 is less than or equal to the diameter E1 of the core area 11. When the thickness E2 of the flip area is equal to the diameter E1 of the core area 11, the flip area 12 entirely overlaps the core area 11, that is to say that the flip area 12 and the core area 11 are merged.

According to the third variant of the first embodiment, the core area 11 is solid, that is to say filled with a solid material, for example polymer.

It may be noted that within a same FORP fibre 10, the core area 11 may have several consecutive sections, and notably at least one first solid section, and at least one second hollow section.

Such a core area 11 having at least one first solid section and at least one second hollow section may be qualified as "semi-hollow".

The geometry and the dimensions of the core area 11 and the flip area 12 on the one hand, and the properties of the flip dye and the photonic crystal on the other hand, are chosen in order to contribute to high quantum coupling between the flip dye and the photonic crystal, in the forbidden spectral band. Thus, in a FORP fibre 10 according to any of the variants of the first embodiment of the invention, the core area 11 has a thickness E1 less than or equal to five times the wavelength of the maximum fluorescence emission of the flip dye. Advantageously, the thickness E1 of the core area 11 is less than or equal to three times the wavelength of the maximum fluorescence emission of the flip dye. Moreover, the flip area 12 advantageously has a thickness E2 such that:

$$E2 < \frac{\lambda_E}{4*n}$$

with $\lambda_E$ the wavelength of the maximum fluorescence emission of the flip dye of the flip area 12, and n the refractive index of the flip area 12.

The quantum coupling thus favoured ensures inhibition of fluorescence de-excitation outside of the axis of the FORP fibre 10 and forces fluorescence de-excitation in the axis of the FORP fibre 10. The optimisation of this quantum coupling thus contributes to obtaining a flux of output photons Ph_s at the output of the FORP fibre 10 significantly more important than in the case of a conventional fibre. For a same beam of incident photons Ph_i, the conversion efficiency of a FORP fibre 10 according to the first embodiment of the invention is thus significantly greater than that of a conventional fibre: it is greater than 80% at the maximum, absorption wavelength of the fluorescent flip dye, whereas it is only of the order of 10% in devices of the prior art.

The fluorescent flip dye may comprise organic fluorescent molecules, or alternatively inorganic chromophores such as rare earths—for example complexes of lanthanides—or oxides, or instead quantum-dots—for example lead sulphide PbS, with a maximum absorption at 650 nm and a maximum emission at 850 nm. In the case of the use of quantum-dots, the latter are typically diluted in a polymer.

The fluorescent flip dye may for example be selected from among the following list:
  rhodamine 6G, having an absorption maximum at 529 nm and an emission maximum at 551 nm;
  rhodamine 123, having an absorption maximum at 550 nm and an emission maximum at 560 nm;
  rhodamine 101, having an absorption maximum at 568 nm and an emission maximum at 600 nm;
  styril 15, having an absorption maximum at 651 nm and an emission maximum at 880 nm;
  coumarin 30, having an absorption maximum at 407 nm and an emission maximum at 478 nm
  coumarin 6, having an absorption maximum at 459 nm and an emission maximum at 502 nm
  fluorescein, having an absorption maximum at 500 nm and an emission maximum at 540 nm;
  rhodamine B, having an absorption maximum at 542 nm and an emission maximum at 565 nm;
  sulforhodamine 101, having an absorption maximum at 576 nm and an emission maximum at 591 nm;
  cresyl violet, having an absorption maximum at 603 nm and an emission maximum at 623 nm;
  rhodamine 800, having an absorption maximum at 682 nm and an emission maximum at 800 nm;
  oxazine 170, having an absorption maximum at 613 nm and an emission maximum at 640 nm.

Figure 4A:
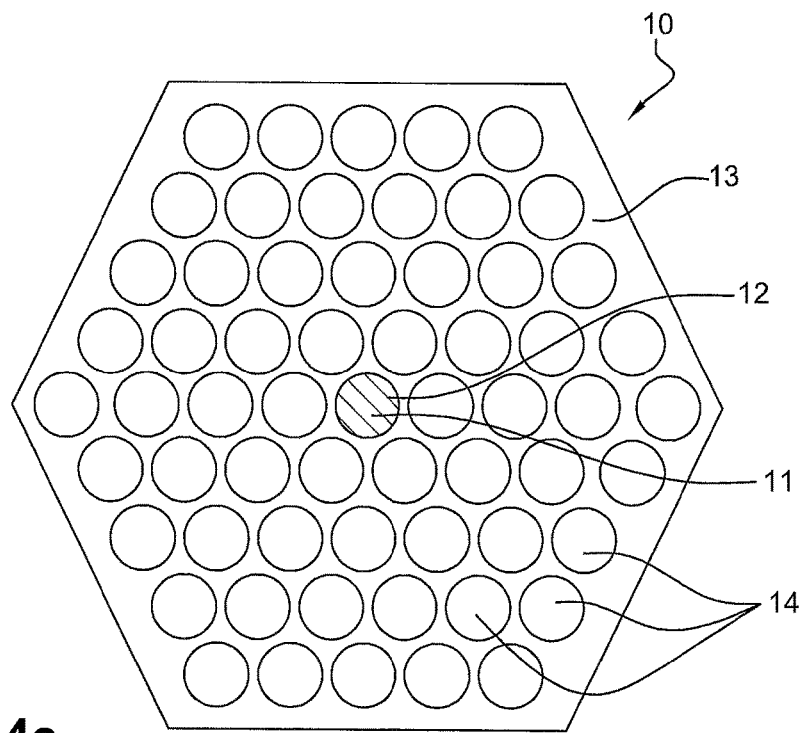
FIG. 4a schematically represents an optical device with photon flipping of "Holey fibre" type, of hexagonal section, and according to the third variant of the first embodiment of the invention.

FIG. 4a schematically represents a FORP fibre 10 of hexagonal section and of "Holey fibre" type, according to the third variant of the first embodiment of the invention. The microstructured cladding area 13 is formed of a material, for example polymer, of optical index greater than 1 and comprising a plurality of holes 14. The holes 14 are typically filled with air, of optical index equal to 1. In the example represented in FIG. 4a, the plurality of holes 14 is arranged according to a hexagonal "honeycomb" network. The plurality of holes 14 is the microstructure of the cladding area 13. The core area 11 is surrounded by the plurality of holes 14. The quality of the photonic crystal is directly linked to its thickness and to the number of patterns seen by the photons. The core area 11 is formed of a material, for example polymer, in which is implanted the fluorescent dye, for example by doping. The flip area 12 is thus in the core area 11.

Figure 4B:
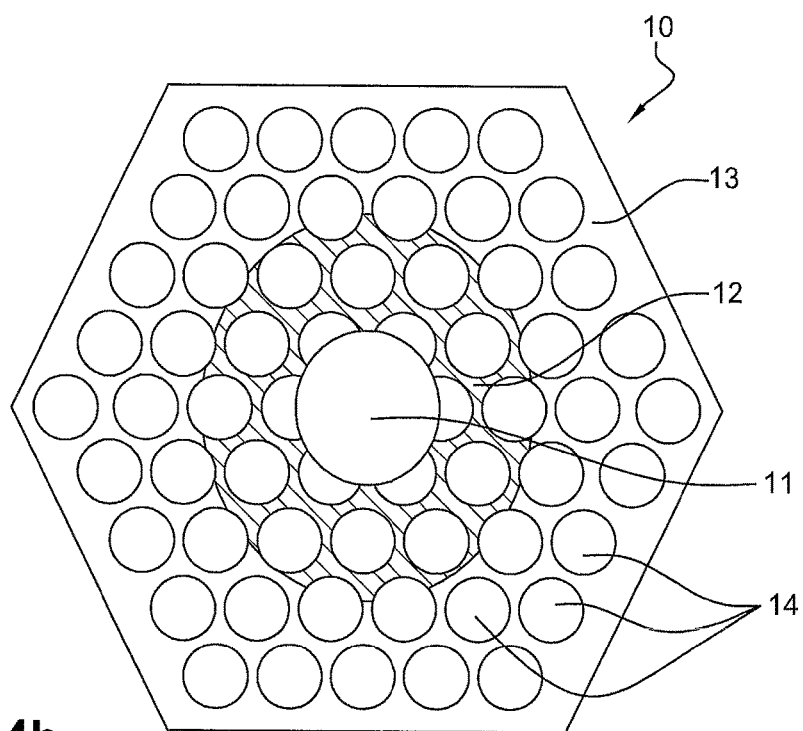
FIG. 4b schematically represents an optical device with photon flipping of "Holey fibre" type, of hexagonal section, and according to the first variant of the first embodiment of the invention.

FIG. 4b schematically represents a FORP fibre 10 of hexagonal section and of "Holey fibre" type, according to the first variant of the first embodiment of the invention. The flip area 12 comprising the fluorescent dye is located this time in the microstructured cladding area 13, around the core area 11. In the particular example represented in FIG. 4b, the core area 11 is hollow. The fluorescent dye is typically implanted in the material of the microstructured cladding area 13 by doping.

Figure 4C:
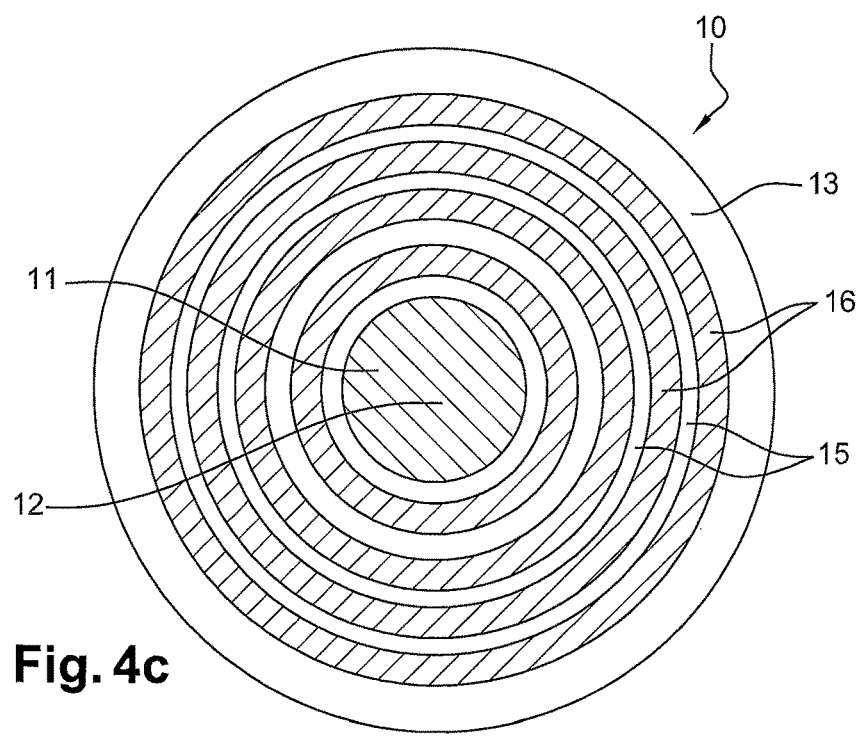
FIG. 4c schematically represents an optical device with photon flipping of Bragg fibre type and according to the third variant of the first embodiment of the invention.

FIG. 4c schematically represents a FORP fibre 10 of circular section and of Bragg fibre type, according to the third variant of the first embodiment of the invention. The microstructured cladding area 13 is formed of an alternation of first 15 and second 16 concentric layers of quarter wave type of two materials of different indices. The first and second layers 15 and 16 are typically made of polymer, for example selected from among the following list:
  polymethyl methacrylate PMMA;
  polystyrene,
  polycarbonate,
  polyacrylate.

Titanium dioxide powder may potentially be added to the polymer used, which has the advantage of increasing its refractive index while allowing it to absorb UV rays.

Thus, it is possible for example to use polymethyl methacrylate PMMA for the first layers 15 and polystyrene or polycarbonate for the second layers 16. As in the example represented in FIG. 4a, the core area 11 is formed of a material, for example polymer, in which is implanted the fluorescent dye, for example by doping. The flip area 2 is thus in the core area 11.

Figure 4D:
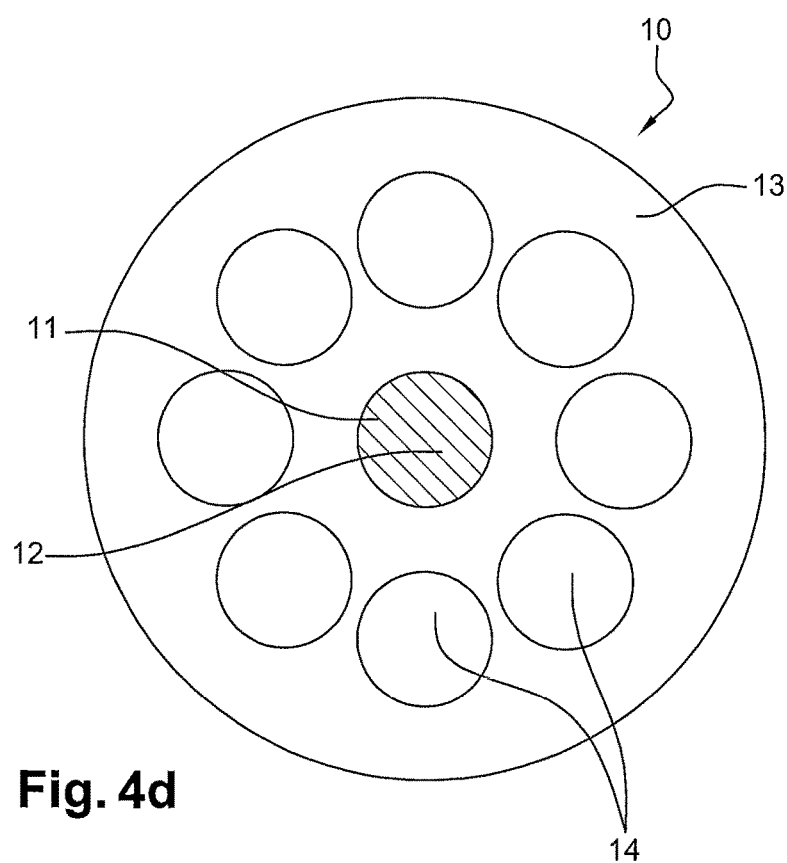
FIG. 4d schematically represents a sectional view of an optical device with photon flipping of "Holey fibre" type, of circular section, and according to the third variant of the first embodiment of the invention.

FIG. 4d schematically represents a FORP fibre 10 of circular section and of "Holey fibre" type, according to the third variant of the first embodiment of the invention. The plurality of holes 14 of the microstructured cladding area 13 is this time arranged according to a ring around the core area 11. As in the examples represented in FIGS. 4a and 4c, the core area 11 is formed of a material, for example polymer, in which is implanted the fluorescent dye, for example by doping. The flip area 12 is thus in the core area 11.

Figure 5A:
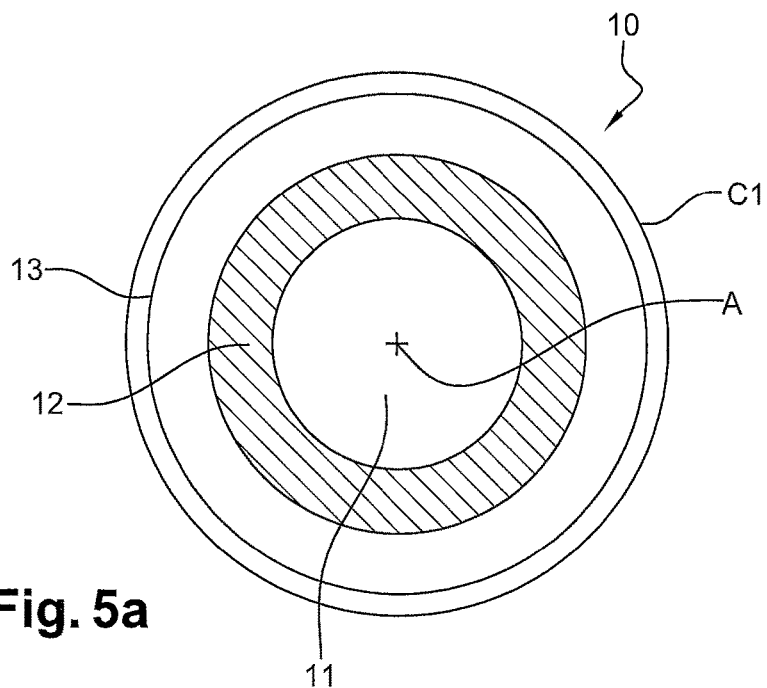
FIG. 5a schematically represents a sectional view of an optical device with photon flipping according to the first variant of the first embodiment of the invention and comprising a first cascade of fluorescent dyes.

FIG. 5a schematically represents a sectional view of an optical device with photon flipping according to the first variant of the first embodiment of the invention, that is to say a FORP fibre 10, which comprises a first conversion area C1 including a first fluorescent conversion dye.

The first conversion area C1 is a hollow cylinder of annular section and of axis A, in other words a tube. The first fluorescent conversion dye is typically implanted in the first conversion area C1 by doping. In the example represented in FIG. 5a, the first conversion area C1 surrounds the microstructured cladding area 13. Alternatively, the first conversion area C1 may be located at least partially in the microstructured cladding area 13.

The principle of this first conversion area C1 is the following:

- The first conversion dye of the first conversion area C1 has an absorption spectral band overlapping at least partially the spectrum of the flux of incident photons Ph_i, and an emission spectral band overlapping at least partially the absorption spectral band of the flip dye of the flip area 12. Since the flux of incident photons Ph_i is typically solar radiation, the first conversion dye will advantageously have an absorption spectral band covering the widest possible range of the solar spectrum. The overlap between the absorption spectral band of the first conversion dye and the spectrum of the flux of incident photons Ph_i is advantageously maximum.
- The part of the incident photons Ph_i of which the wavelength lies within the absorption spectral band of the first conversion dye may be absorbed by said first conversion dye.
- The first conversion dye is then capable of re-emitting by fluorescence de-excitation at least one part of the absorbed photons, at least one part of the re-emitted photons having a wavelength lying within the absorption spectral band of the fluorescent flip dye. The overlap between the emission spectral band of the first conversion dye and the absorption spectral band of the flip dye is advantageously maximum.
- Thus, the flip dye of the flip area 12 is capable of absorbing:
  - on the one hand, the part of the incident photons Ph_i of which the wavelength lies within the absorption spectral band of the flip dye,
  - on the other hand, at least one part of the photons re-emitted by the first conversion dye of the first conversion area C1.

The first conversion dye of the first conversion area C1 thus advantageously makes it possible to increase the quantity of incident photons Ph_i, from an incident light flux, which the flip dye of the flip area 12 is going to be able to absorb. It is said that the first fluorescent conversion dye and the fluorescent flip dye form a cascade of fluorescent dyes.

The first conversion area C1 has been described in the particular case of a FORP fibre 10 according to the first variant of the first embodiment, but it is naturally compatible with any other variant of the first embodiment, and notably with the second and third variants of the first embodiment.

Figure 5B:
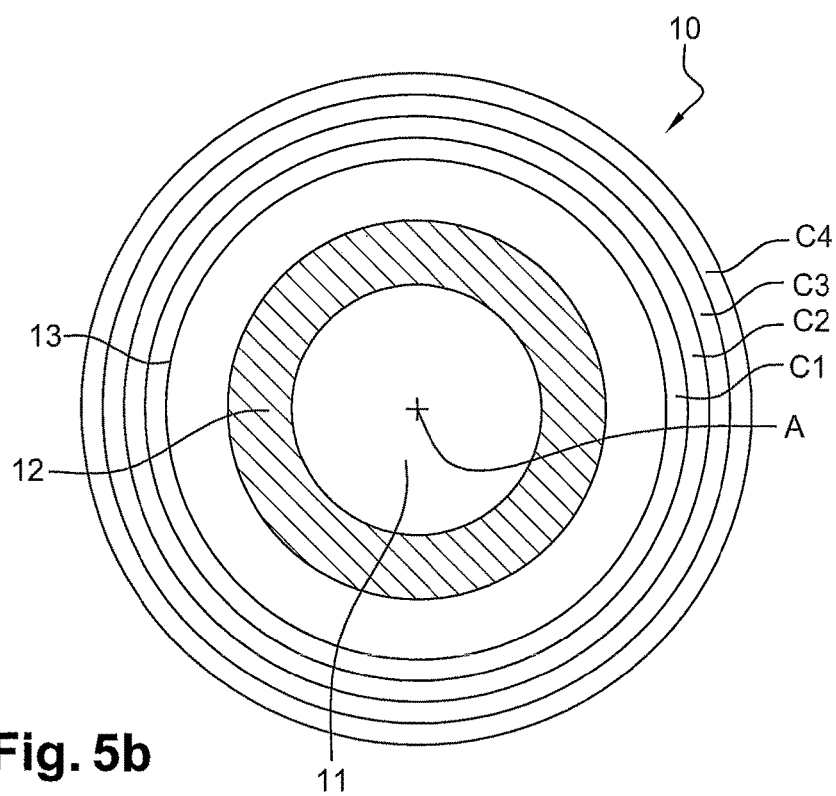
FIG. 5b schematically represents a sectional view of an optical device with photon flipping according to the first variant of the first embodiment of the invention and comprising a second cascade of fluorescent dyes.

The example has been described above of a cascade of fluorescent conversion dyes comprising, apart from the flip dye, a single conversion dye, but it is naturally possible to use a large number of conversion dyes. FIG. 5b schematically represents a sectional view of an optical device with photon flipping according to the first variant of the first embodiment of the invention, that is to say a FORP fibre 10, which comprises:

- the first conversion area C1 including the first fluorescent conversion dye,
- a second conversion area C2 including a second fluorescent conversion dye,
- a third conversion area C3 including a third fluorescent conversion dye,
- a fourth conversion area C4 including a fourth fluorescent conversion dye.

The second, third and fourth conversion areas d C2, C3 and C4 are, in the same way as the first conversion area C1, hollow cylinders of annular section and of axis A, in other words tubes. The second, third and fourth conversion dyes are typically implanted respectively in the second, third and fourth conversion areas C2, C3 and C4 by doping. The second conversion area C2 surrounds the first conversion area C1; the third conversion area C3 surrounds the second conversion area C2 and the fourth conversion area C4 surrounds the third conversion area C3. In the example represented in FIG. 5b, the first, second, third and fourth conversion areas C1, C2, C3 and C4 surround the microstructured cladding area 13. Alternatively, the microstructured cladding area 13 may comprise at least one part of the set formed by the first, second, third and fourth conversion areas C1, C2, C3 and C4. The first, second, third and fourth conversion dyes form with the flip dye a cascade of fluorescent dyes of which the operation is the following:

- The fourth conversion dye of the fourth conversion area C4 has an absorption spectral band overlapping at least partially the spectrum of the flux of incident photons Ph_i. The part of the incident photons Ph_i of which the wavelength lies within the absorption spectral band of the fourth conversion dye may be absorbed by said fourth conversion dye, then re-emitted at a wavelength lying within the emission spectral band of the fourth conversion dye. The overlap between the absorption spectral band of the fourth conversion dye and the spectrum of the flux of incident photons Ph_i is advantageously maximum.
- The third conversion dye of the third conversion area C3 is chosen so that its absorption spectral band overlaps at least partially the emission spectral band of the fourth conversion dye. Thus, the third conversion dye is capable of absorbing:
  - on the one hand, the part of incident photons Ph_i of which the wavelength lies within the absorption spectral band of the third conversion dye,
  - and, on the other hand, the photons re-emitted by the fourth conversion dye.

The third conversion dye can then re-emit by fluorescence de-excitation at least one part of the absorbed photons, at a higher wavelength lying within its fluorescence emission band. The overlap between the emission spectral band of the fourth conversion dye and the absorption spectral band of the third conversion dye is advantageously maximum.

- On the same principle, the second conversion dye of the second conversion area C2 is chosen in order that its absorption spectral band overlaps at least partially the emission spectral band of the third conversion dye. The second conversion dye is then capable of absorbing not only the part of the incident photons Ph_i of which the wavelength lies within its absorption spectral band, but also the photons re-emitted by the third conversion dye. The overlap between the emission spectral band of the third conversion dye and the absorption spectral band of the second conversion dye is advantageously maximum.
- Finally, in the example of FIG. 5b, the first conversion dye of the first conversion area C1 is this time chosen so that its absorption spectral band overlaps at least partially the emission spectral band of the second conversion dye, and that its emission spectral band overlaps at least partially with the absorption spectral band of the fluorescent flip dye of the flip area 12. The first conversion dye can then absorb the part of the photons of the incident flux of which the wavelength lies within its absorption spectral band, as well as the photons re-emitted by fluorescence de-excitation by the second dye. The first conversion dye can then re-emit by fluorescence de-excitation at least one part of the absorbed photons, at least one part of the re-emitted photons having a wavelength lying within the absorption spectral band of the fluorescent flip dye. The overlap between the emission spectral band of the second conversion dye and the absorption spectral band of the first conversion dye is advantageously maximum. Similarly, the overlap between the emission spectral band of the first conversion dye and the absorption spectral band of the flip dye is advantageously maximum.

Generally speaking, the sum of the absorption spectral bands of the fluorescent conversion dye(s), as well as the fluorescent flip dye, forming the absorption spectral band of the cascade of fluorescent dyes, covers the widest possible range of the solar spectrum. It may be noted that the solar spectrum extends at ground level from between 280 nm and 4000 nm. In the same way as for the fluorescent flip dye, the fluorescent conversion dye(s) may for example be: rhodamine 6G, rhodamine 123, rhodamine 101, styril 15, coumarin 30, coumarin 6, fluorescein, rhodamine B, sulforhodamine 101, cresyl violet, rhodamine 800 or oxazine 170. For a better understanding of the operation of a cascade of fluorescent dyes, the particular case according to which each fluorescent conversion dye is located in a particular conversion area has been described above. Nevertheless, several fluorescent conversion dyes may absolutely be mixed in a single and same conversion area, without modifying the cascade operating principle which has just been described. An example of interesting embodiment is thus that according to which a single conversion area comprises all of the fluorescent conversion dyes.

Advantageously, a FORP fibre 10 according to the first embodiment of the invention may also comprise:
an antireflective layer and/or
an anti-UV protective layer and/or
a protective layer against mechanical aggressions.

The antireflective layer preferentially surrounds the microstructured cladding area 13 or, if need be, the outermost conversion area of the cascade of fluorescent dyes. The anti-UV protective layer preferentially surrounds, if need be, the antireflective layer. The protective layer against mechanical aggressions preferentially surrounds, if need be, the anti-UV protective layer.

The anti-UV protective layer is capable of absorbing ultraviolet photons. In an optional manner, the anti-UV protective layer may advantageously be fluorescent and absorb photons of wavelength lying within the interval [280 nm-400 nm] to re-emit them at wavelengths greater than 400 nm. In fact, photons of wavelength less than 400 nm are capable of degrading the optical properties of the polymer materials typically used in the production of FORP fibres 10, as well as contributing to the photolysis and to the destruction of the fluorescent flip dye and/or, if appropriate, at least one fluorescent conversion dye, particularly if it is an organic fluorescent dye. The antireflective protective layer could for example be made of PMMA, ethylene vinyl acetate EVA or polyvinyl butyral PVB. To enable fluorescence of the antireflective protective layer, it is possible for example to use titanium dioxide, beta-carboline, 7-hydroxy-4-methylcoumarin, POPOP (also called "1,4-bis(5-phenyloxazol-2-yl)benzene"), bis-MSB (also called "1,4-bis(2-methylstyryl)benzol"), beta barium borate BBO, p-terphenyl or biphenyl. An antireflective and anti-UV layer could advantageously be used instead of the antireflective layer and the anti-UV protective layer.

The protective layer against mechanical aggressions may be made of PVB or EVA.

The description will now be made, in relation with FIGS. 6a, 6b and 6c, of an optical device with photon flipping 30 according to the second embodiment of the invention. The optical device with photon flipping 30 according to this second embodiment has optical film geometry with FORP photon flipping: the optical device with photon flipping 30 extends along a reference plane P and has symmetry with respect to said reference plane P.

Figure 6A:
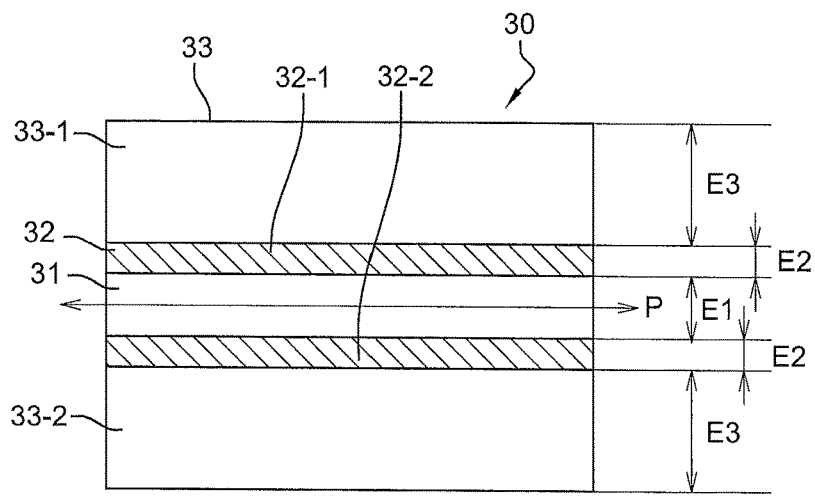
FIG. 6a schematically represents a sectional view of an optical device with photon flipping according to a first variant of a second embodiment of the invention.
Figure 6B:
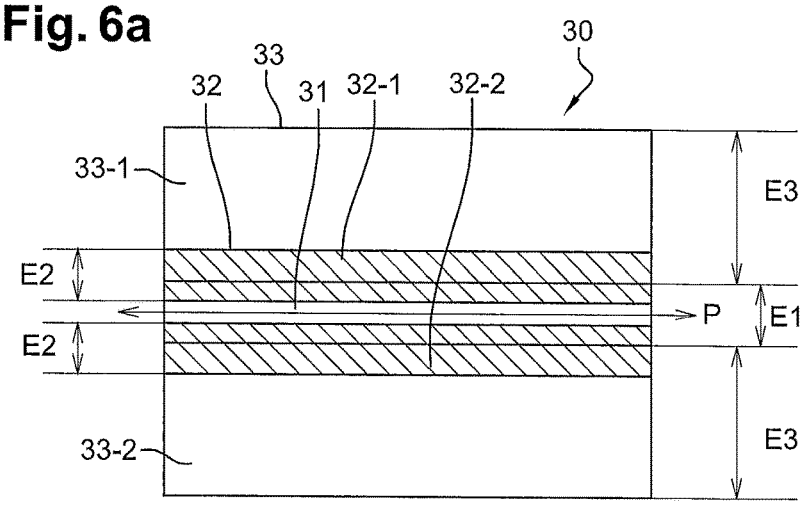
FIG. 6b schematically represents a sectional view of an optical device with photon flipping according to a second variant of the second embodiment of the invention.
Figure 6C:
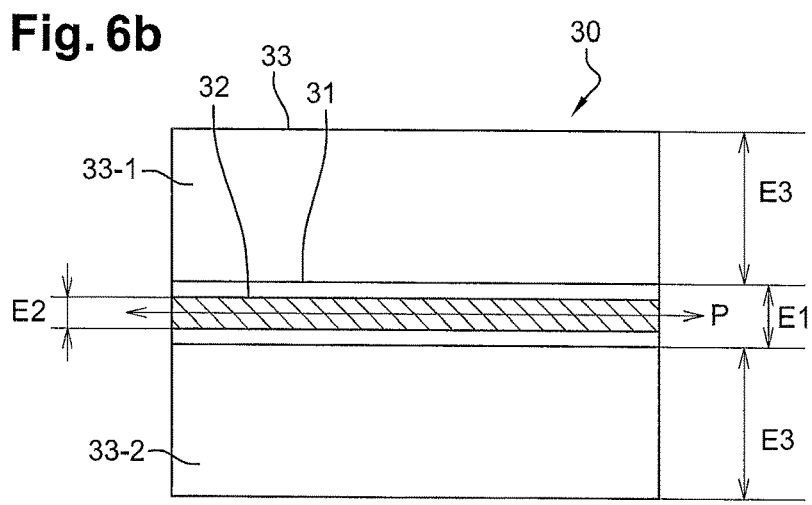
FIG. 6c schematically represents a sectional view of an optical device with photon flipping according to a third variant of the second embodiment of the invention.

FIGS. 6a, 6b and 6c are described jointly. FIGS. 6a, 6b and 6c show a FORP film 30 including:
a core area 31 extending along the reference plane P, the core area 31 being for example formed of a polymer material,
a flip area 32 including a fluorescent flip dye and extending parallel to the reference plane P,
a microstructured cladding area 33 including a first region 33-1 and a second region 33-2 arranged on either side of the core area 31. The first and second regions 33-1 and 33-2 of the microstructured cladding area 33 may for example each comprise a Bragg stack, that is to say an alternation of quarter wave layers of two materials of different indices, for example polymethyl methacrylate PMMA on the one hand and polystyrene on the other hand.

The core area 31 has a thickness E1 measured perpendicularly to the reference plane P. The first and second regions 33-1 and 33-2 of the microstructured cladding area 33 each have a thickness E3 measured perpendicularly to the reference plane P.

FIG. 6a schematically represents a sectional view, along a sectional plane perpendicular to the reference plane P, of a FORP film 30 according to a first variant of the second embodiment. The first variant of the second embodiment is analogous to the first variant of the first embodiment, described previously in relation with FIG. 3a. Thus, according to the first variant of the second embodiment, the flip area 32 is located in at least one part of the microstructured cladding area 33. The flip area 32 thus has:
a first region 32-1 situated in at least one part of the first region 33-1 of the microstructured cladding area 33 and in contact with the core area 31, and
a second region 32-2 situated in at least one part of the second region 33-2 of the microstructured cladding area 33 and in contact with the core area 31.

The first and second regions 32-1 and 32-2 of the flip area 32 each have a thickness E2, measured perpendicularly to the reference plane P, which is less than or equal to the thickness E3 of the first and second regions 33-1 and 33-2 of the microstructured cladding area 33. When the thickness E2 of the first and second regions 32-1 and 32-2 of the flip area 32 is equal to the thickness E3 of the first and second regions 33-1 and 33-2 of the microstructured cladding area 33, the flip area 32 is merged with the microstructured cladding area 33.

FIG. 6b schematically represents a sectional view, along a sectional plane perpendicular to the reference plane P, of a FORP film 30 according to a second variant of the second embodiment. The second variant of the second embodiment is analogous to the second variant of the first embodiment, described previously in relation with FIG. 3b. Thus, according to the second variant of the second embodiment, the flip area 32 is located in at least one part of the microstructured cladding area 33 and in at least one part of the core area 31. The flip area 32 thus has:
- a first region 32-1 situated in at least one part of the first region 33-1 of the microstructured cladding area 33 and in at least one part of the core area 31, and
- a second region 32-2 situated in at least one part of the second region 33-2 of the microstructured cladding area 33 and in at least one part of the core area 31.

The first and second regions 32-1 and 32-2 of the flip area 32 each have a thickness E2, measured perpendicularly to the reference plane P, such that:

$$E2 \le \frac{E1}{2} + E3$$

When the thickness E2 of the first and second regions 32-1 and 32-2 of the flip area 32 is such that $$E2 = \frac{E1}{2} + E3,$$

the flip area 32 completely covers the microstructured cladding area 33 and the core area 31.

FIG. 6c schematically represents a sectional view, along a sectional plane perpendicular to the reference plane P, of a FORP film 30 according to a third variant of the second embodiment. The third variant of the second embodiment is analogous to the third variant of the first embodiment, described previously in relation with FIG. 3c. Thus, according to the third variant of the second embodiment, the flip area 32 is located in at least one part of the core area 31. The flip area 32 may thus have a single region, situated in at least one part of the core area 31 and having a thickness E2, measured perpendicularly to the reference plane P, which is less than or equal to the thickness E1 of the core area 31. When the thickness E2 of the flip area 32 is equal to the thickness E1 of the core area, the flip area 32 is merged with the core area 31.

In an alternative not represented in FIG. 6c, the flip area 32 may have:
- a first region 32-1 situated in a part of the core area 31 and in contact with the first region 33-1 of the microstructured cladding area 33, and
- a second region 32-2 situated in a part of the core area 31 and in contact with the second region 33-2 of the microstructured cladding area 33.

According to this alternative, the first and second regions 32-1 and 32-2 of the flip area 32 each have a thickness E2, measured perpendicularly to the reference plane P, which is such that:

$$E2 < \frac{E1}{2}.$$

It may be noted according to the first, second and third variants of the second embodiment, the core area 31 is solid, that is to say filled with a solid material, for example polymer.

In the same way as for the FORP fibre 10 according to the first embodiment described previously, in a FORP film 30 according to the second embodiment, the geometry and the dimensions of the core area 31 and the flip area 32 on the one hand, and the properties of the flip dye and the photonic crystal on the other hand, are chosen in order to contribute to high quantum coupling between the fluorescent flip dye and the photonic crystal, in the forbidden spectral band. Thus, in a FORP film 30 according to any of the variants of the second embodiment of the invention, the thickness E1 of the core area 31 is less than or equal to five times the wavelength of the maximum fluorescence emission of the flip dye. Advantageously, the thickness E1 of the core area 11 is less than or equal to three times the wavelength of the maximum fluorescence emission of the flip dye. Moreover, the thickness E2 of the flip area 32 or, if need be, the first and second regions 32-1 and 32-2 of the flip area 32 is advantageously such that:

$$E2 < \frac{\lambda_E}{4 * n}$$

with $\lambda_E$ the wavelength of the maximum fluorescence emission of the flip dye of the flip area 32, and n the refractive index of the flip area 32.

A FORP film 30 according to any of the variants of the second embodiment of the invention may advantageously comprise one or more additional characteristics among the following, considered individually or according to any technically possible combinations thereof:
- the FORP film 30 comprises at least one conversion area including a conversion dye, said conversion dye forming a cascade of fluorescent dyes with the flip dye of the flip area 32. The operating principle of such a cascade of fluorescent dyes has been described previously in the case of the first embodiment, in relation with FIGS. 5a and 5b. The conversion area of the FORP film 30 has first and second regions which extend parallel to the reference plane P, on either side of the first and second regions 33-1 and 33-2 of the microstructured cladding area 33, or alternatively in at least one part of the first and second regions 33-1 and 33-2 of the microstructured cladding area 33.
- The FORP film 30 comprises an antireflective layer as described previously in the case of the first embodiment, preferentially surrounding the microstructured cladding area 33 or, if need be, the outermost conversion area of the cascade of fluorescent dyes. In the particular case of the second embodiment, the antireflective layer has first and second regions that extend parallel to the reference plane P, on either side of the first and second regions 33-1 and 33-2 of the microstructured cladding area 33 or, if need be, on either side of the first and second regions of the outermost conversion area of the cascade of fluorescent dyes.
- The FORP film 30 comprises an anti-UV protective layer as described previously in the case of the first embodiment, surrounding preferentially, if need be, the antireflective layer. In the particular case of the second embodiment, the anti-UV protective layer has first and second regions that extend parallel to the reference plane P, on either side, if need be, of the first and second regions of the antireflective layer.
- The FORP film 30 comprises a protective layer against mechanical aggressions as described previously in the case of the first embodiment, preferentially surrounding, if need be, the anti-UV protective layer. In the particular case of the second embodiment, the protective layer against mechanical aggressions has first and second regions that extend parallel to the reference plane P, on either side, if need be, of the first and second regions of the anti-UV protective layer.

In order to increase the collection of incident photons, it is advantageously possible to use several optical devices with photon flipping, for example according to the first or the second embodiment that have been described, to form a multi-core optical device with photon flipping. In particular:

several FORP fibres 10 according to any of the variants of the first embodiment may be used to form a multi-core FORP fibre, several FORP films 30 according to any of the variants of the second embodiment may be used to form a multi-core FORP film. A multi-core FORP film thus comprises a stack of a plurality of FORP films 30.

Figure 7A:
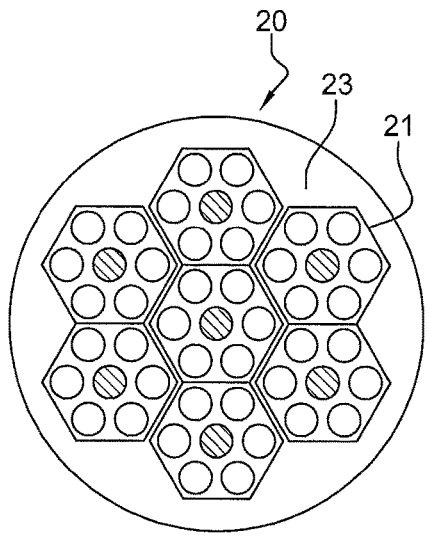
FIGS. 7a and 7b show first and second examples of multi-core fibres comprising a plurality of optical devices with photon flipping according to the first embodiment of the invention.
Figure 7B:
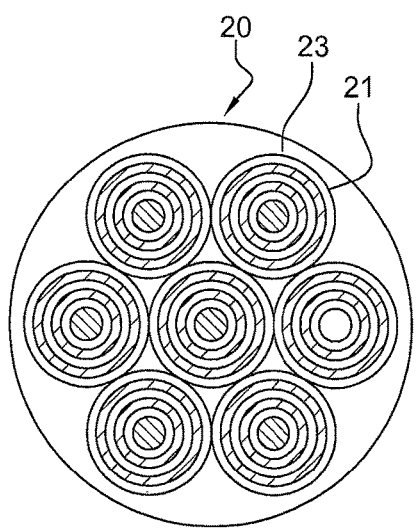

FIGS. 7a and 7b show first and second examples of multi-core FORP fibres 20, comprising a plurality of FORP fibres 10 according to the first embodiment of the invention.

FIG. 7a shows a first example of a multi-core FORP fibre 20, of which the core area 21 comprises a plurality of FORP fibres 10. According to this first example, the core area 21 of the multi-core FORP fibre 20 comprises seven FORP fibres 10 of "Holey fibre" type, described in particular in FIG. 4d, arranged according to a hexagonal network. The multi-core FORP fibre 20 comprises a cladding area 23 that surrounds the plurality of FORP fibres 10 of the core area 21.

FIG. 7b shows a second example of multi-core FORP fibre 20, of which the core area 21 comprises seven FORP fibres 10 of Bragg fibre type, described in particular in FIG. 4c and arranged according to a hexagonal network. A multi-core FORP fibre 20 has an efficiency greater than the simple sum of the efficiencies of each FORP fibre 10. Such a multi-core FORP fibre device 20 thus has more extensive structural coherent effects than in a FORP fibre 10, which is reflected notably by a stronger confinement and a higher quality factor.

In particular in FIGS. 7a and 7b are illustrated examples of multi-core FORP fibres 20, of which the core areas 21 each comprise seven fibres FORP 10. Nevertheless, the core area 21 of a multi-core FORP fibre 20 could naturally comprise a quantity of FORP fibres 10 less than or greater than seven. In particular, a multi-core FORP fibre 20 complying with an aspect of the invention could advantageously have a core area 21 comprising a number of FORP fibres 10 of the order of a thousand, or a million.

Figure 8:
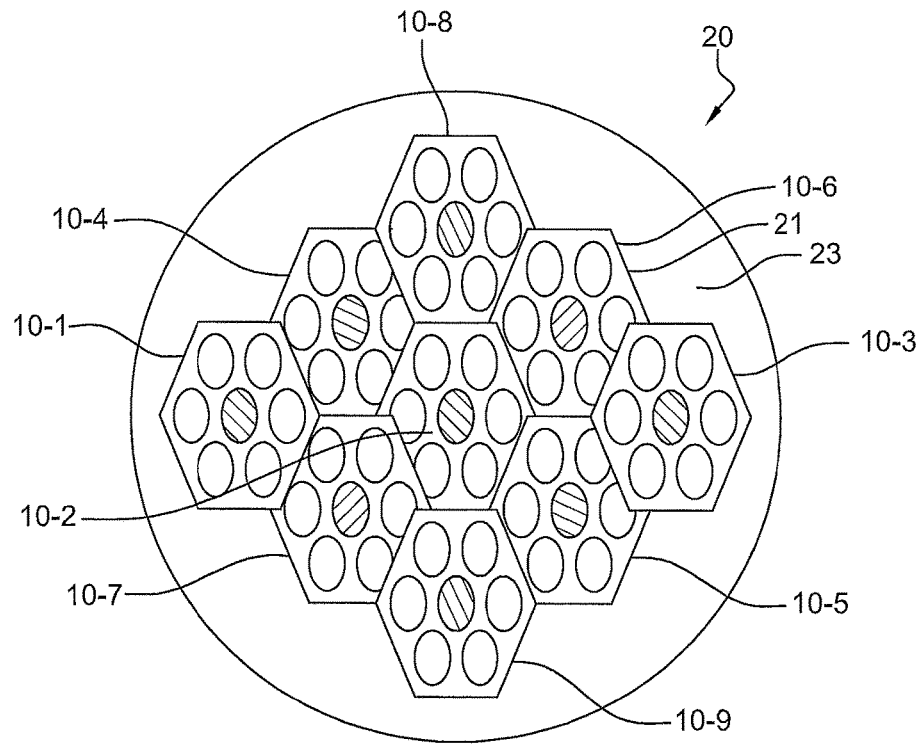
FIG. 8 shows a third example of a multi-core fibre having a core area comprising a plurality of optical devices with photon flipping according to the first embodiment of the invention.

FIG. 8 shows a third example of a multi-core FORP fibre 20, comprising a cladding area 23 surrounding a core area 21 comprising nine FORP fibres 10 according to the first embodiment. Each of said nine FORP fibres 10 is, in the particular example represented in FIG. 7, of "Holey fibre" type, more particularly described previously in relation with FIG. 4a. The particular advantage of this third example of multi-core FORP fibre 20 resides in the fact that several different fluorescent flip dyes are used in the respective flip areas of the FORP fibres 10. Said fluorescent flip dyes are advantageously chosen in order that the sum of their respective absorption spectral bands covers the widest possible spectral width, while overlapping as little as possible. Thus, a multi-core FORP fibre 20 according to this third example advantageously has increased efficiency for capturing incident photons Ph_i.

In the particular example represented in FIG. 8, there is thus:

first, second and third FORP fibres 10-1, 10-2 and 10-3 of which the flip area comprises a first flip dye, fourth and fifth FORP fibres 10-4 and 10-5 of which the flip area comprises a second flip dye, distinct from the first flip dye, sixth and seventh FORP fibres 10-6 and 10-7 of which flip area comprises a third flip dye, distinct from the first and second flip dyes, eighth and ninth FORP fibres 10-8 and 10-9 of which flip area comprises a fourth flip dye, distinct from the first, second and third flip dyes.

A multi-core optical device with photon flipping, such as a multi-core FORP fibre or a multi-core FORP film, may advantageously comprise one or more additional characteristics among the following, considered individually or according to any technically possible combinations thereof:

the optical device with photon flipping comprises at least one conversion area including a conversion dye, said conversion dye forming a cascade of fluorescent dyes with the flip dye of each FORP fibre 10 or FORP film 30 of said multi-core device. The operating principle of such a cascade of fluorescent dyes has been described previously. The conversion area preferentially surrounds the cladding area of the multi-core device, or is located alternatively in at least one part of the cladding area of the multi-core device.

the multi-core optical device with photon flipping comprises an antireflective layer as described previously, preferentially surrounding the cladding area or, if need be, the outermost conversion area of the cascade of fluorescent dyes.

the multi-core optical device with photon flipping comprises an anti-UV protective layer as described previously, preferentially surrounding, if need be, the antireflective layer.

the multi-core optical device with photon flipping comprises a protective layer against mechanical aggressions as described previously, preferentially surrounding, if need be, the anti-UV protective layer.

Figure 9A:
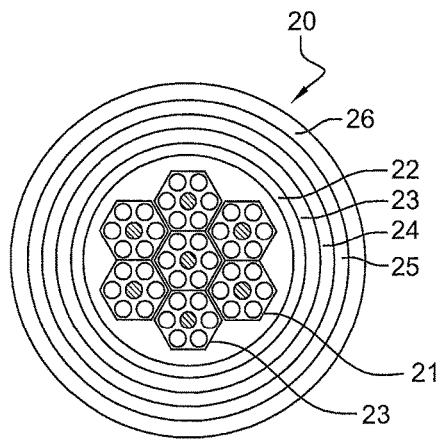
FIGS. 9a and 9b show first and second examples of multi-core fibres comprising a cascade of fluorescent conversion dyes.
Figure 9B:
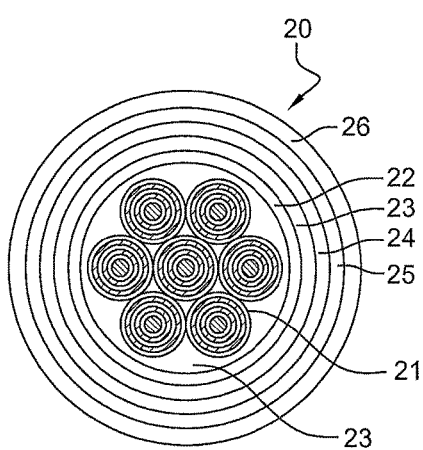

FIGS. 9a and 9b, described jointly, show respectively a first example of a multi-core FORP fibre 20, as described in particular in FIG. 7a, and a second example of a multi-core fibre FORP 20, as described in particular in FIG. 7b, further comprising:

a first conversion area 22 including a first fluorescent conversion dye, a second conversion area 23 including a second fluorescent conversion dye, a third conversion area 24 including a third fluorescent conversion dye, a fourth conversion area 25 including a fourth fluorescent conversion dye, an antireflective and anti-UV protective layer 26.

The fourth conversion area 25 surrounds the third conversion area 24. The third conversion area 24 surrounds the second conversion area 23. The second conversion area 23 surrounds the first conversion area 22. All of the conversion areas 22, 23, 24 and 25 may either surround the cladding area 23, or be located partially or completely in the cladding area 23. The antireflective and anti-UV protective layer 26 surrounds the fourth conversion area 25. In the case where the fourth conversion area 25 is in the cladding area 23, the antireflective and anti-UV protective layer 26 surrounds the cladding area 23.

An order of magnitude of the dimensions of a multi-core FORP fibre 20 may for example be the following:

diameter of the core area 21, including the plurality of FORP fibres 10: of the order of 400 μm, thickness of the cladding area 23, including potentially one or more conversion areas of a cascade of fluorescent conversion dyes: of the order of 50 µm, i.e. an accumulated diameter for the core area and the cladding area 23 of the order of 500 µm, thickness of the potential protective antireflective and anti-UV layer: of the order of 30 µm, i.e. an accumulated diameter for the core area, the cladding area 23 and the antireflective and anti-UV protective layer of the order of 560 µm, thickness of the potential protective layer against mechanical aggressions: of the order of 20 µm, i.e. a cumulated diameter for the core area, the cladding area 23, the antireflective and anti-UV protective layer and the protective layer against mechanical aggressions of the order of 600 µm.

Several examples of optical solar concentrators comprising at least one optical device with photon flipping, such as a FORP fibre 10 according to the first embodiment or a FORP film 30 according to the second embodiment will now be described.

Generally speaking, an optical solar concentrator includes:
at least one optical device with photon flipping, that is to say for example at least one FORP fibre 10 or at least one FORP film 30;
at least one photovoltaic cell Ce.

An optical solar concentrator may advantageously comprise one or more additional characteristics among the following, considered individually or according to any technically possible combinations thereof:
at least one means of guiding the photons emitted by the at least one device with photon flipping to the at least one photovoltaic cell Ce,
a reflective film, for example made of aluminised polymer. The reflective film advantageously makes it possible to increase the collection efficiency of incident photons. In fact, in the case where an incident photon has passed through the at least one device with photon flipping without interacting with a fluorescent flip dye, this incident photon may be reflected by the reflective film and thus acquire a new possibility of being captured, converted and guided by said at least one device with photon flipping,
a protective screen, advantageously making it possible to protect the optical solar concentrator against mechanical aggressions and/or against ultraviolet radiation,
a frame, for example made of polycarbonate or of epoxy resin. The frame advantageously makes it possible to increase the robustness of the optical solar concentrator, and to facilitate the mechanical implantation of the different elements of the optical solar concentrator during its manufacture.

Figure 10A:
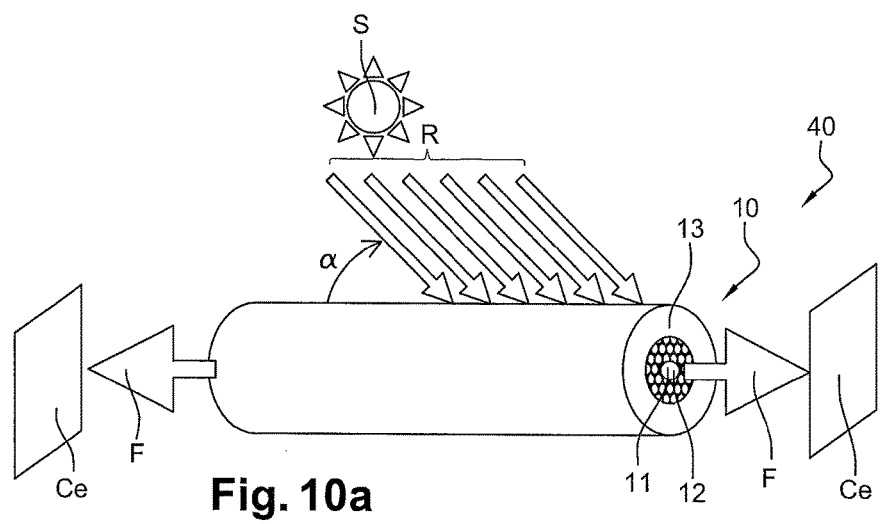
FIG. 10a schematically illustrates a first example of an optical solar concentrator comprising an optical device with photon flipping according to an embodiment of the invention.

FIG. 10a schematically illustrates a first example of an optical solar concentrator 40 comprising a FORP fibre 10. The optical solar concentrator 40 further comprises first and second photovoltaic cells Ce arranged on either side of the FORP fibre 10.

FIG. 10a shows a source S of polychromatic and multidirectional light; this source S is typically the sun. The source S emits a polychromatic radiation R, of which the spectrum is for example comprised between 400 nm and 800 nm. This radiation R is represented in FIG. 10a for a given angle of incidence. The FORP fibre 10 captures laterally at least one part of the polychromatic and multidirectional radiation R in its microstructured cladding area 13. The FORP fibre 10 converts in its flip area 12 at least one part of the captured radiation R into a quasi-monochromatic and unidirectional flux F, along the axis of the FORP optical fibre. Finally, the FORP fibre 10 guides the flux F in its core area 11. First and second photovoltaic cells Ce are arranged on either of the FORP fibre 10 so as to capture the flux F emitted at the output of the FORP fibre 10. The photovoltaic cells Ce can thus ensure a conversion of the luminous flux F into electricity.

Figure 10B:
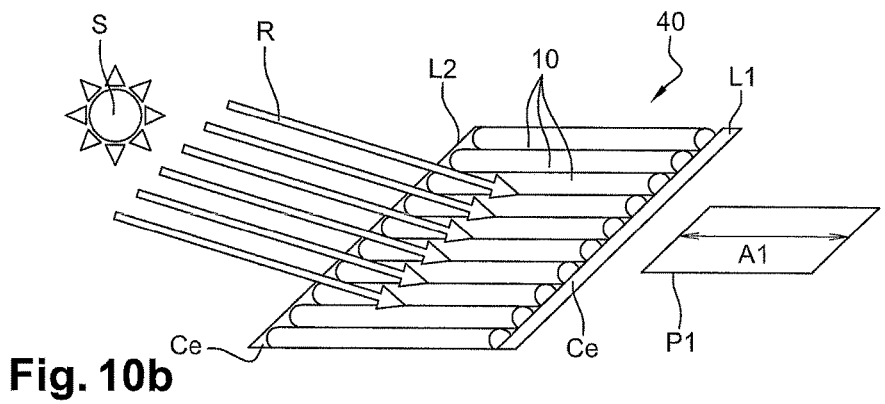
FIG. 10b schematically illustrates a second example of an optical solar concentrator comprising an optical device with photon flipping according to an embodiment of the invention.

FIG. 10b schematically illustrates a second example of an optical solar concentrator 40 comprising a plurality of FORP fibres 10, forming a first carpet T1 of first FORP fibres 10. The first carpet T1 extends parallel to a first plane P1. The first FORP fibres 10 extend along a first axis A1. The optical solar concentrator of FIG. 10b further comprises first and second sets of photovoltaic cells Ce, forming first and second photovoltaic lines L1 and L2. The first and second photovoltaic lines L1 and L2 are arranged on either side of the first carpet T1, perpendicularly to the first axis A1, so as to be able to capture then to convert into electricity the luminous flux emitted by the first FORP fibres 10.

Figure 10C:
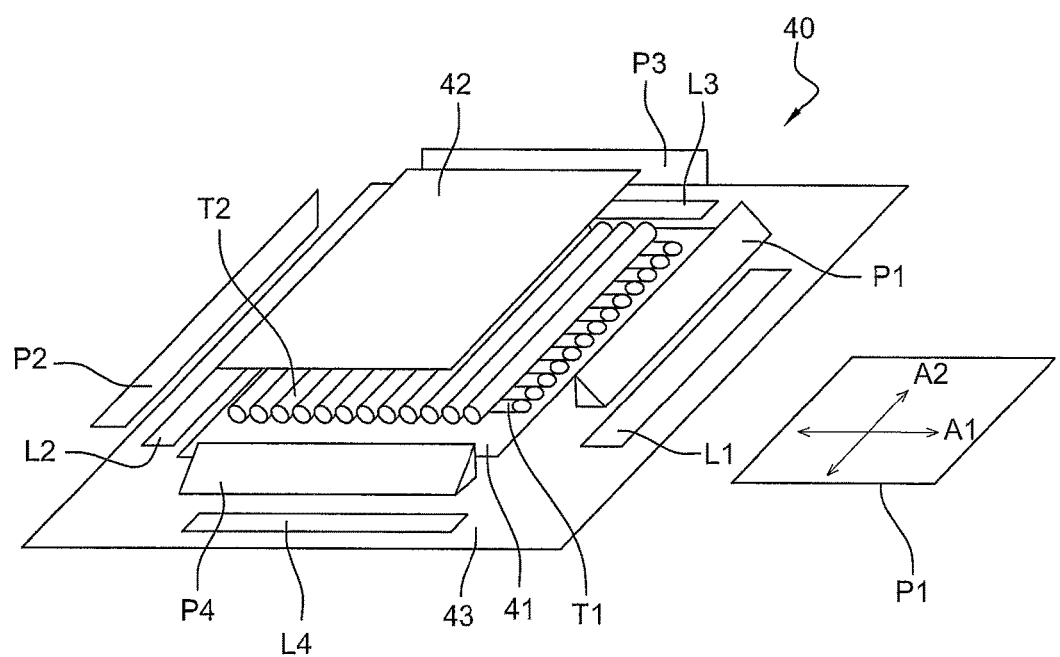
FIG. 10c schematically illustrates a third example of an optical solar concentrator comprising an optical device with photon flipping according to an embodiment of the invention.

FIG. 10c schematically illustrates an exploded view of a third example of an optical solar concentrator 40 comprising first and second carpets T1 and T2 of FORP fibres 10. More precisely, the optical solar concentrator 40 comprises a frame 43 extending along the first plane P1, and a reflective film 41 extending onto the frame 43.

The first carpet T1 of first FORP fibres 10 extends onto the reflective film 41 and a second carpet T2 of second FORP fibres 10 extends onto the first carpet T1. The first FORP fibres 10 of the first carpet T1 extend parallel to the first axis A1. The second FORP fibres 10 of the second carpet T2 extend parallel to a second axis A2 substantially perpendicular to the first axis A1.

The optical solar concentrator 40 according to the third example illustrated in FIG. 10c comprises first, second, third and fourth photovoltaic lines L1, L2, L3 and L4, each photovoltaic line including at least one photovoltaic cell Ce.

The first and second photovoltaic lines L1 and L2 are intended to receive photons emitted by the first FORP fibres 10 of the first carpet T1. The first and second photovoltaic lines L1 and L2 are advantageously arranged on either side of the first carpet T1, along an axis substantially perpendicular to the first axis A1. The first and second lines T1 and T2 may for example extend onto the frame 43. First and second prisms P1 and P2 could be used in order to contribute to guiding the photons emitted by the first FORP fibres of the first carpet T1, respectively to the first and second photovoltaic lines L1 and L2.

In an analogous manner, the third and fourth photovoltaic lines L3 and L4 are intended to receive photons emitted by the second FORP fibres 10 of the second carpet T2. The third and fourth photovoltaic lines L3 and L4 are advantageously arranged on either side of the second carpet T2, along an axis substantially perpendicular to the second axis A2. The third and fourth lines T3 and T4 may for example extend onto the frame 43. Third and fourth prisms P3 and P4 could be used in order to contribute to guiding photons emitted by the second FORP fibres of the second carpet T2, respectively to the third and fourth photovoltaic lines L3 and L4. Finally, a protective screen 42 may advantageously extend onto the second carpet T2.

In the example that has just been described, each of the first and second carpets T1 and T2 extends parallel to the first plane P1. Alternatively, the first and second carpets T1 and T2 of FORP fibres may respectively extend along a curved plane.

The particular case has been described where the first FORP fibres of the first carpet T1 are arranged substantially perpendicularly to the second FORP fibres of the second carpet T2. Nevertheless, the angle between the axis of the first FORP fibres of the first carpet T1 on the one hand, and the axis of the second FORP fibres of the second carpet T2 on the other hand, could more generally be comprised between 0° and 360°.

It is also entirely possible to use at least one multi-core fibre 20 in an optical solar concentrator 40, and for example at least one carpet of multi-core fibres 20. Similarly, it is also possible to use at least one multi-core film in an optical solar concentrator 40.

The photovoltaic cells Ce are chosen so that their range of maximum photovoltaic quantum effect efficiency coincides with the wavelength of the photons emitted at the output of the optical device with photon flipping.

The photovoltaic cells Ce may typically be made from a semiconductor material. The photovoltaic cells Ce are then chosen so that the wavelength of the forbidden spectral band of said semiconductor material is different to the wavelength of the photons emitted at the output of the optical device with photon flipping.

The case is considered where the optical solar concentrator 40 comprises several optical devices with photon flipping, comprising respectively different fluorescent flip dyes and wavelength ranges. In this case, for each wavelength range, a different type of photovoltaic cell Ce could naturally be used, for example made from different semiconductor materials, chosen to optimise the capture of photons lying within said wavelength range.

Alternatively, the photovoltaic cells may be multi-junction semiconductor cells. Thus, several beams of photons of different wavelengths may be captured efficiently by a single type of photovoltaic cell. This possibility is notably interesting in the case of an optical solar concentrator 40 comprising several FORP fibres 10 or several FORP films 30 emitting in different wavelength ranges, and/or at least one multi-core fibre 20 or at least one multi-core film emitting in different wavelength ranges.

Other devices may be envisaged, which implement at least one optical device with photon flipping according to an embodiment of the invention. Thus, an optical device with photon flipping according to an embodiment of the invention may advantageously be used to concentrate an incident light flux, for example solar radiation, on the following devices:
  a catalytic cell, for example a hydrogenation by catalysis cell, notably in order to synthesise fuels such as hydrogen, or hydrocarbons such as alkanes or alcohols;
  a laser rod, in order to pump it.

The invention claimed is:

1. An optical device with photon flipping for converting an incident light flux into a quasi-monochromatic light beam, the optical device comprising:
  a cladding area including a photonic crystal microstructure, wherein the photonic crystal microstructure has an allowed spectral band and a forbidden spectral band;
  a flip area including a fluorescent flip dye having:
    a fluorescence absorption spectral band overlapping at least partially the allowed spectral band of the photonic crystal microstructure, and
    a fluorescence emission spectral band overlapping at least partially the forbidden spectral band of the photonic crystal microstructure,
  a core area arranged to enable the propagation of a monochromatic light beam having a wavelength lying within the forbidden spectral band of the photonic crystal microstructure, the core area being surrounded by the photonic crystal microstructure of the cladding area,
wherein the core area has a thickness less than or equal to five times the wavelength of a maximum fluorescence emission of the fluorescent flip dye.

2. The optical device according to claim 1, wherein the thickness of the core area is less than or equal to three times the wavelength of the maximum fluorescence emission of the fluorescent flip dye.

3. The optical device according to claim 1, wherein the flip area has a thickness E2 such that:

$$E2 < \frac{\lambda_E}{4*n}$$

with $\lambda_E$ the wavelength of the maximum fluorescence emission of the fluorescent flip dye and n the refractive index of the flip area.

4. The optical device according to claim 1, wherein the flip area is situated in at least one part of the cladding area.

5. The optical device according to claim 1, wherein the flip area is situated in at least one part of the core area.

6. The optical device according to claim 5, wherein the flip area is situated in at least one central part of the core area.

7. The optical device according to claim 1, having optical fibre geometry, the optical device extending along a reference axis and having a symmetry of revolution around said reference axis.

8. The optical device according to claim 1, having optical film geometry, the optical device extending along a reference plane and having symmetry with respect to said reference plane.

9. The optical device according to claim 1, further comprising a first conversion area situated around the flip area, the first conversion area including a first fluorescent conversion dye having a fluorescence emission spectral band overlapping at least partially the fluorescence absorption spectral band of the fluorescent flip dye.

10. A multi-core optical device with photon flipping comprising:
  a core area comprising a plurality of optical devices with photon flipping according to claim 1, and
  a cladding area surrounding the core area.

11. An electricity production device comprising:
  at least one optical device with photon flipping according to claim 1, and
  at least one photovoltaic cell arranged to be able to capture the quasi-monochromatic light beam emitted at an output of at an output of the at least one optical device with photon flipping.

12. A catalysis device comprising:
  at least one optical device with photon flipping according to claim 1, and
  at least one catalytic cell arranged to be able to capture the quasi-monochromatic light beam emitted at an output of the at least one device with photon flipping.

13. A laser emission device comprising:
  at least one optical device with photon flipping according to claim 1, and
  at least one laser arranged to be able to capture the quasi-monochromatic light beam emitted at an output of the at least one device with photon flipping.

* * * * *

UNITED STATES PATENT AND TRADEMARK OFFICE
CERTIFICATE OF CORRECTION

PATENT NO. : 10,331,011 B2
APPLICATION NO. : 15/302678
DATED : June 25, 2019
INVENTOR(S) : Olivier Besida It is certified that error appears in the above-identified patent and that said Letters Patent is hereby corrected as shown below:

On the Title Page

Item (71) Applicant:
Correct the Assignee name as follows:
COMMISSARIAT À L'ÉNERGIE ATOMIQUE ET AUX ÉNERGIES ALTERNATIVES, Paris (FR)

Signed and Sealed this
Sixth Day of August, 2019

Andrei Iancu
*Director of the United States Patent and Trademark Office*